(12) United States Patent
Imahayashi et al.

(10) Patent No.: US 8,318,588 B2
(45) Date of Patent: Nov. 27, 2012

(54) METHOD FOR REPROCESSING SEMICONDUCTOR SUBSTRATE, METHOD FOR MANUFACTURING REPROCESSED SEMICONDUCTOR SUBSTRATE, AND METHOD FOR MANUFACTURING SOI SUBSTRATE

(75) Inventors: Ryota Imahayashi, Kanagawa (JP); Hideto Ohnuma, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/859,547

(22) Filed: Aug. 19, 2010

(65) Prior Publication Data

US 2011/0065263 A1 Mar. 17, 2011

(30) Foreign Application Priority Data

Aug. 25, 2009 (JP) .................. 2009-194318

(51) Int. Cl.
*H01L 21/46* (2006.01)
*H01L 21/36* (2006.01)
(52) U.S. Cl. .............. 438/459; 438/479; 438/787
(58) Field of Classification Search .......... 438/458, 438/455, 459, 478, 47, 480, 787, 800, 906, 438/959; 257/E21.214, E21.219, E21.227, 257/E21.23, E21.237, E21.601

See application file for complete search history.

(56) References Cited

U.S. PATENT DOCUMENTS

| | | | |
|---|---|---|---|
| 3,640,806 A * | 2/1972 | Watanabe et al. ............ | 438/441 |
| 4,731,516 A | 3/1988 | Noguchi et al. | |
| 5,374,564 A | 12/1994 | Bruel | |
| 5,494,849 A | 2/1996 | Iyer et al. | |
| 5,559,043 A | 9/1996 | Bruel | |
| 5,840,616 A | 11/1998 | Sakaguchi et al. | |
| 5,969,398 A | 10/1999 | Murakami | |

(Continued)

FOREIGN PATENT DOCUMENTS

EP 0 955 671 11/1999

(Continued)

OTHER PUBLICATIONS

Kriegler et al., "The Effect of HCl and Cl₂ on the Thermal Oxidation of Silicon," J. Electorchem. Soc.: Solid-State Science and Technology, Mar. 1972, 119 (3), pp. 388-392.

(Continued)

*Primary Examiner* — Olik Chaudhuri
*Assistant Examiner* — Quovaunda V Jefferson
(74) *Attorney, Agent, or Firm* — Eric J. Robinson; Robinson Intellectual Property Law Office, P.C.

(57) ABSTRACT

It is an object of the invention is to provide a method suitable for reprocessing a semiconductor substrate having favorable planarity. Another object of the invention is to manufacture a reprocessed semiconductor substrate by using the method suitable for reprocessing a semiconductor substrate having favorable planarity, and to manufacture an SOI substrate by using the reprocessed semiconductor substrate. A projecting portion of a semiconductor substrate is removed using a method capable of selectively removing a semiconductor region which is damaged by ion irradiation or the like. Further, an oxide film is formed on a surface of the semiconductor substrate when the semiconductor substrate is planarized by a polishing treatment typified by a CMP method, whereby the semiconductor substrate is evenly polished at a uniform rate. Moreover, a reprocessed semiconductor substrate is manufactured using the aforementioned method, and an SOI substrate is manufactured using the reprocessed semiconductor substrate.

22 Claims, 8 Drawing Sheets

U.S. PATENT DOCUMENTS

| | | | |
|---|---|---|---|
| 6,010,579 | A | 1/2000 | Henley et al. |
| 6,110,845 | A | 8/2000 | Seguchi et al. |
| 6,127,702 | A | 10/2000 | Yamazaki et al. |
| 6,245,645 | B1 * | 6/2001 | Mitani et al. .................. 438/455 |
| 6,251,754 | B1 | 6/2001 | Ohshima et al. |
| 6,271,101 | B1 | 8/2001 | Fukunaga |
| 6,284,628 | B1 | 9/2001 | Kuwahara et al. |
| 6,335,231 | B1 | 1/2002 | Yamazaki et al. |
| 6,344,404 | B1 | 2/2002 | Cheung et al. |
| 6,372,609 | B1 | 4/2002 | Aga et al. |
| 6,380,046 | B1 | 4/2002 | Yamazaki |
| 6,388,652 | B1 | 5/2002 | Yamazaki et al. |
| 6,426,270 | B1 | 7/2002 | Sakaguchi et al. |
| 6,468,923 | B1 | 10/2002 | Yonehara et al. |
| 6,500,731 | B1 * | 12/2002 | Nakagawa et al. ........... 438/455 |
| 6,521,492 | B2 | 2/2003 | Miyasaka et al. |
| 6,534,380 | B1 | 3/2003 | Yamauchi et al. |
| 6,548,382 | B1 | 4/2003 | Henley et al. |
| 6,596,610 | B1 | 7/2003 | Kuwabara et al. |
| 6,602,761 | B2 | 8/2003 | Fukunaga |
| 6,613,678 | B1 | 9/2003 | Sakaguchi et al. |
| 6,686,623 | B2 | 2/2004 | Yamazaki |
| 6,720,640 | B2 | 4/2004 | Kuwabara et al. |
| 6,778,164 | B2 | 8/2004 | Yamazaki et al. |
| 6,803,264 | B2 | 10/2004 | Yamazaki et al. |
| 6,815,309 | B2 | 11/2004 | Letertre et al. |
| 6,875,633 | B2 * | 4/2005 | Fukunaga ..................... 438/107 |
| 6,927,148 | B2 | 8/2005 | Ito |
| 7,022,586 | B2 | 4/2006 | Maleville et al. |
| 7,064,049 | B2 | 6/2006 | Ito et al. |
| 7,119,365 | B2 | 10/2006 | Takafuji et al. |
| 7,176,525 | B2 | 2/2007 | Fukunaga |
| 7,183,177 | B2 | 2/2007 | Al-Bayati et al. |
| 7,199,024 | B2 | 4/2007 | Yamazaki |
| 7,256,776 | B2 | 8/2007 | Yamazaki et al. |
| 7,297,611 | B2 | 11/2007 | Maleville |
| 7,315,064 | B2 | 1/2008 | Mitani et al. |
| 7,354,844 | B2 | 4/2008 | Endo et al. |
| 7,364,984 | B2 | 4/2008 | Endo et al. |
| 7,387,944 | B2 | 6/2008 | Tong et al. |
| 7,402,520 | B2 | 7/2008 | Donohoe et al. |
| 7,405,136 | B2 | 7/2008 | Delprat et al. |
| 7,413,964 | B2 | 8/2008 | Reynaud et al. |
| 7,442,623 | B2 | 10/2008 | Endo et al. |
| 7,508,034 | B2 | 3/2009 | Takafuji et al. |
| 7,531,425 | B2 | 5/2009 | Nakano et al. |
| 7,531,428 | B2 | 5/2009 | Dupont |
| 7,579,654 | B2 | 8/2009 | Couillard et al. |
| 7,608,521 | B2 | 10/2009 | Cites et al. |
| 7,619,250 | B2 | 11/2009 | Takafuji et al. |
| 7,759,233 | B2 | 7/2010 | Forbes |
| 7,763,541 | B2 | 7/2010 | Okuda et al. |
| 7,767,549 | B2 | 8/2010 | Okuda et al. |
| 7,767,583 | B2 | 8/2010 | Ramappa et al. |
| 7,808,098 | B2 | 10/2010 | Sugiyama et al. |
| 7,867,877 | B2 | 1/2011 | Morita et al. |
| 2001/0046746 | A1 | 11/2001 | Yokokawa et al. |
| 2002/0048844 | A1 | 4/2002 | Sakaguchi |
| 2002/0157790 | A1 | 10/2002 | Abe et al. |
| 2003/0124815 | A1 | 7/2003 | Henley et al. |
| 2003/0170990 | A1 * | 9/2003 | Sakaguchi et al. ............ 438/690 |
| 2004/0061176 | A1 | 4/2004 | Takafuji et al. |
| 2004/0104424 | A1 | 6/2004 | Yamazaki |
| 2004/0259328 | A1 * | 12/2004 | Ito et al. ........................ 438/459 |
| 2005/0009252 | A1 | 1/2005 | Yamazaki et al. |
| 2006/0148208 | A1 | 7/2006 | Popov et al. |
| 2006/0228846 | A1 | 10/2006 | Endo et al. |
| 2007/0063281 | A1 | 3/2007 | Takafuji et al. |
| 2007/0108510 | A1 | 5/2007 | Fukunaga |
| 2007/0141803 | A1 | 6/2007 | Boussagol et al. |
| 2007/0148912 | A1 | 6/2007 | Morita et al. |
| 2007/0148914 | A1 | 6/2007 | Morita et al. |
| 2007/0173000 | A1 | 7/2007 | Yamazaki |
| 2007/0184632 | A1 | 8/2007 | Yamazaki et al. |
| 2007/0249139 | A1 | 10/2007 | Gadkaree et al. |
| 2007/0291022 | A1 | 12/2007 | Yamazaki et al. |
| 2008/0124929 | A1 | 5/2008 | Okuda et al. |
| 2008/0153272 | A1 | 6/2008 | Akiyama et al. |
| 2008/0224940 | A1 | 9/2008 | Sugiyama et al. |
| 2008/0280420 | A1 | 11/2008 | Yamazaki |
| 2009/0081848 | A1 | 3/2009 | Erokhin et al. |
| 2009/0093102 | A1 | 4/2009 | Moriwaka |
| 2009/0098704 | A1 | 4/2009 | Ohnuma et al. |
| 2009/0111245 | A1 | 4/2009 | Okabe et al. |
| 2009/0115028 | A1 | 5/2009 | Shimomura et al. |
| 2009/0170287 | A1 | 7/2009 | Endo et al. |
| 2009/0209085 | A1 | 8/2009 | Tamura et al. |
| 2010/0022070 | A1 | 1/2010 | Imahayashi |
| 2010/0062546 | A1 | 3/2010 | Endo et al. |
| 2010/0273310 | A1 | 10/2010 | Hanaoka et al. |
| 2010/0330777 | A1 | 12/2010 | Hanaoka |
| 2010/0330778 | A1 | 12/2010 | Hanaoka |
| 2011/0053345 | A1 | 3/2011 | Hanaoka et al. |
| 2011/0086492 | A1 | 4/2011 | Ohnuma et al. |

FOREIGN PATENT DOCUMENTS

| | | |
|---|---|---|
| EP | 0 961 312 | 12/1999 |
| EP | 1 202 339 | 5/2002 |
| EP | 1 427 001 | 6/2004 |
| EP | 1 427 002 | 6/2004 |
| EP | 1 791 174 | 5/2007 |
| EP | 1 970 952 | 9/2008 |
| EP | 2 048 697 | 4/2009 |
| EP | 2 091 075 | 8/2009 |
| EP | 1156531 | * 11/2011 |
| JP | 2000-223682 | 8/2000 |
| JP | 2001-155978 | 6/2001 |
| JP | 2004-087606 | 3/2004 |
| JP | 2005-072070 | 3/2005 |
| JP | 3932369 | 6/2007 |
| WO | 2008/007508 | 1/2008 |

OTHER PUBLICATIONS

Vossen et al., "Thin film processes II," Academic Press, pp. 317-323, 1991.

Lu et al., "Ion-cut silicon-on-insulator fabrication with plasma immersion ion implantation," Appl. Phys. Lett., Nov. 10, 1997, 71 (19), pp. 2767-2769.

* cited by examiner

With cycle cleaning

Without cycle cleaning

METHOD FOR REPROCESSING SEMICONDUCTOR SUBSTRATE, METHOD FOR MANUFACTURING REPROCESSED SEMICONDUCTOR SUBSTRATE, AND METHOD FOR MANUFACTURING SOI SUBSTRATE

BACKGROUND OF THE INVENTION

1. Field of the Invention

One technical field of the disclosed invention relates to a method for reprocessing a semiconductor substrate. The disclosed invention also relates to a method for manufacturing a reprocessed semiconductor substrate utilizing the method for reprocessing a semiconductor substrate, and a method for manufacturing a silicon-on-insulator (SOI) substrate.

2. Description of the Related Art

In recent years have been developed integrated circuits which use a silicon-on-insulator (SOI) substrate in which a thin single crystal silicon layer is formed on an insulating surface, instead of those using a bulk silicon wafer. By utilizing the characteristics of a thin single crystal silicon layer formed on an insulating surface, transistors formed in the integrated circuit can be electrically separated from each other. Further, transistors can be fully-depleted, so that a semiconductor integrated circuit with high added value such as high integration, high speed driving, and low power consumption can be realized.

As a method for manufacturing an SOI substrate, a hydrogen ion implantation separation method is known. The hydrogen ion implantation separation method is as follows: a single crystal silicon substrate (bond substrate) into which a hydrogen ion is implanted is bonded to another substrate (base substrate) with an insulating layer interposed therebetween, and the single crystal silicon substrate (bond substrate) is separated at an ion implantation region by a thermal treatment, so that a single crystal silicon layer is obtained. By using the hydrogen ion implantation separation method, an SOI substrate which has a single crystal silicon layer on an insulating substrate such as a glass substrate can be manufactured (for example, see Patent Document 1).

REFERENCE

Patent Document 1

Patent Document 1: Japanese Published Patent Application No. 2004-87606

SUMMARY OF THE INVENTION

In case of using a hydrogen ion implantation separation method as a method for manufacturing an SOI substrate, a plurality of SOI substrates can be manufactured from one bond substrate. Thus, there is an advantage in that the cost of a bond substrate in manufacturing an SOI substrate can be reduced. This is because, by performing a reprocessing treatment on the bond substrate from which a single crystal silicon layer has been separated, the bond substrate after use can be used again to manufacture an SOI substrate.

Here, a bond substrate such as a single crystal silicon substrate used for the hydrogen ion implantation separation method has a region called an edge roll off (E. R. O.) in the periphery due to a treatment which uses a chemical mechanical polishing (CMP) method in the manufacturing step of the bond substrate. The region is formed by polishing an edge of the bond substrate with a polishing cloth. The surface of an edge roll off region of the bond substrate is curved, and the edge roll off region has a smaller thickness than the center region of the bond substrate.

In case of using the ion implantation separation method to manufacture an SOI substrate, a bond substrate and a base substrate are bonded to each other by a mechanism of intermolecular force or van der Waals force. Thus, a bonding surface needs to have a certain degree of planarity. In the edge roll off region where the surface planarity cannot be secured, the bond substrate and the base substrate are not bonded to each other.

Therefore, a single crystal silicon layer region that has not been separated and an insulating layer remain as a projecting portion in a region corresponding to the edge roll off region of the bond substrate from which the single silicon layer has been separated. The projecting portion becomes a problem in a reprocessing step of the bond substrate. The difference in height between the projecting portion and the other region (the region where the bonding is performed adequately) is several hundred nanometers at most. However, in order to remove the projecting portion by polishing the surface with the CMP method and to reuse the bond substrate for manufacturing an SOI substrate, approximately 10 µm-thick semiconductor needed to be removed. Thus, the number of times of reprocessing and use of the bond substrate cannot be kept large enough. In particular, for reprocessing a bond substrate having favorable planarity, an important quantity of semiconductor material needs to be removed.

In view of the above problem, one object of an embodiment of the disclosed invention is to provide a method suitable for reprocessing a semiconductor substrate having favorable planarity. Another object of an embodiment of the disclosed invention is to manufacture a reprocessed semiconductor substrate by using the method suitable for reprocessing a semiconductor substrate having favorable planarity, and to manufacture an SOI substrate by using the reprocessed semiconductor substrate.

According to one embodiment of the disclosed invention, a projecting portion is removed using a method capable of selectively removing a semiconductor region which is damaged by ion irradiation or the like. Further, an oxide film is formed on a surface of a semiconductor substrate when the semiconductor substrate is planarized by a polishing treatment typified by a CMP method, whereby the semiconductor substrate is evenly polished at a uniform rate. Moreover, a reprocessed semiconductor substrate is manufactured using the aforementioned method, and an SOI substrate is manufactured using the reprocessed semiconductor substrate. Detailed description is given below.

One embodiment of the present invention is a method for reprocessing a semiconductor substrate including the steps of: performing an etching treatment on a semiconductor substrate, a part of which has been separated as a semiconductor layer by ion irradiation and a heat treatment, resulting in that a projecting portion including a damaged semiconductor region and an insulating layer remains in the periphery, whereby the insulating layer is removed; performing an etching treatment on the semiconductor substrate using a solution containing a substance that oxidizes a semiconductor material included in the semiconductor substrate, a substance that dissolves the oxidized semiconductor material, and a substance that controls the speed of oxidation of the semiconductor material and the speed of dissolution of the oxidized semiconductor material, whereby the damaged semiconductor region is selectively removed with a non-damaged semiconductor region left; forming an oxide film on a surface of the semiconductor substrate; and performing a polishing treatment on a surface of the oxide film, whereby the surface of the semiconductor substrate is exposed and planarized.

Another embodiment of the present invention is a method for reprocessing a semiconductor substrate including the steps of: performing an etching treatment on a semiconductor substrate, a part of which has been separated as a semiconductor layer by ion irradiation and a heat treatment, resulting in that a projecting portion including a damaged semiconductor region and an insulating layer remains in the periphery, whereby the insulating layer is removed; performing an etching treatment on the semiconductor substrate using a solution containing a substance that oxidizes a semiconductor material included in the semiconductor substrate, a substance that dissolves the oxidized semiconductor material, and a substance that controls the speed of oxidation of the semiconductor material and the speed of dissolution of the oxidized semiconductor material, whereby the damaged semiconductor region is selectively removed with a non-damaged semiconductor region left; performing an etching treatment for removing a first oxide film that remains partly in the etching treatment for selectively removing the damaged semiconductor region; forming a second oxide film on a surface of the semiconductor substrate; and performing a polishing treatment on a surface of the second oxide film, whereby the surface of the semiconductor substrate is exposed and planarized.

Note that the second oxide film is preferably formed using an aqueous solution containing ozone. It is also preferable to repeatedly perform the etching treatment for removing the first oxide film and forming the second oxide film. The etching treatment for removing the first oxide film is preferably performed using a solution containing hydrofluoric acid. Further, a CMP treatment is preferably performed as the polishing treatment.

The ion irradiation may be performed with or without mass separation. The ions preferably include an $H_3^+$ ion. It is also preferable that nitric acid be used as the substance that oxidizes a semiconductor material included in the semiconductor substrate, hydrofluoric acid be used as the substance that dissolves the oxidized semiconductor material, and acetic acid be used as the substance that controls the speed of oxidation of the semiconductor material and the speed of dissolution of the oxidized semiconductor material.

Another embodiment of the present invention is a method for manufacturing a reprocessed semiconductor substrate from a semiconductor substrate by using the aforementioned method. Still another embodiment of the present invention is a method for manufacturing an SOI substrate, in which a reprocessed semiconductor substrate manufactured using the aforementioned method is irradiated with ions to form an embrittlement region therein, the reprocessed semiconductor substrate is bonded to a base substrate with an insulating layer interposed therebetween, and the reprocessed semiconductor substrate is separated by a heat treatment, whereby a semiconductor layer is formed on the base substrate.

Note that in this specification and the like, an SOI substrate refers to a substrate in which a semiconductor layer is formed on an insulating surface, and is not limited to a structure in which a silicon layer is formed on an insulating layer. For example, the SOI substrate may have a structure in which a silicon layer is formed directly on a glass substrate or a structure in which a silicon carbide layer is formed on an insulating layer.

According to one embodiment of the disclosed invention, a damaged semiconductor region can be selectively removed with respect to a non-damaged semiconductor region (or a semiconductor region which is less damaged). Consequently, the amount of semiconductor removed in the reprocessing treatment of a semiconductor substrate can be sufficiently reduced, so that the semiconductor substrate can be reprocessed and reused enough times. Also, according to one embodiment of the disclosed invention, an oxide film is formed on a surface of a semiconductor substrate when the semiconductor substrate is planarized by a polishing treatment such as a CMP method, whereby the semiconductor substrate is evenly polished at a uniform rate. As a result, a semiconductor substrate having favorable planarity can be manufactured.

Moreover, by manufacturing a reprocessed semiconductor substrate using the aforementioned method for reprocessing a semiconductor substrate, the amount of semiconductor removed in the reprocessing treatment can be sufficiently reduced. Accordingly, cost for manufacturing the reprocessed semiconductor substrate can be reduced.

Furthermore, when an SOI substrate is manufactured using the above reprocessed semiconductor substrate, cost for manufacturing the SOI substrate can be sufficiently reduced.

DETAILED DESCRIPTION OF THE INVENTION

Figure 1A:
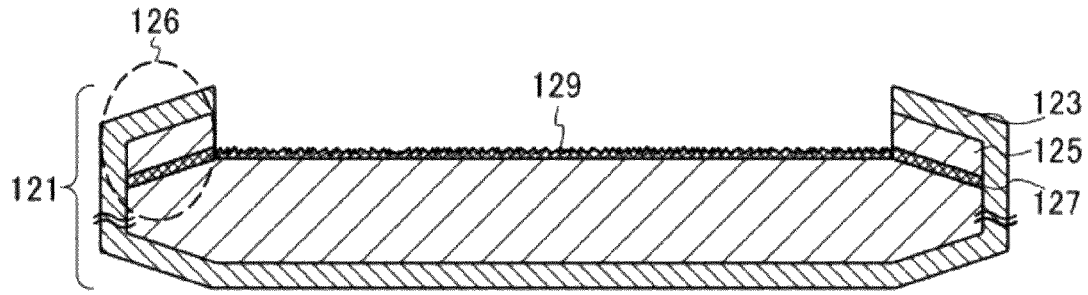
FIGS. 1A to 1D are cross-sectional views showing a method for reprocessing a semiconductor substrate.

Hereinafter, embodiments of the present invention will be described with reference to the drawings. However, the present invention can be implemented in various modes, and it will be apparent to those skilled in the art that modes and details thereof can be changed in various ways without departing from the purpose and scope of the present invention. Therefore, the present invention should not be interpreted as being limited to the description of the embodiments. Note that in this specification and the like, identical portions or portions having a similar function are denoted by the identical reference numerals, and description thereon is omitted in some cases.

Embodiment 1

In this embodiment, a method for reprocessing a semiconductor substrate will be described using FIGS. 1A to 1D.

FIG. 1A shows an example of the structure of a semiconductor substrate 121 before a reprocessing treatment (a semiconductor substrate from which a semiconductor layer has been separated). In the periphery of the semiconductor substrate 121, there is a projecting portion 126. The projecting portion 126 includes an insulating layer 123, an unseparated semiconductor region 125 and a semiconductor region 127. Note that the unseparated semiconductor region 125 and the semiconductor region 127 are both damaged by an ion irradiation treatment or the like in the manufacturing process of an SOI substrate, and include many crystal defects, voids, blisters, and the like. Thus, the unseparated semiconductor region 125 and the semiconductor region 127 can be collectively called a damaged semiconductor region. Note that in contrast to a single crystal semiconductor region in which atoms constituting a crystal are arranged in a spatially ordered manner, the damaged semiconductor region refers to a region partly including disordered arrangements (crystal structures) of atoms constituting crystals, crystal defects, crystal lattice distortion, and the like due to irradiation of an ion and the like. Further, a non-damaged semiconductor region refers to a single crystal semiconductor region with atoms constituting a crystal which are arranged in a spatially ordered manner, and is equivalent to a single crystal semiconductor region which is not subjected to ion irradiation or the like.

The above described projecting portion 126 includes a so-called edge roll off (E. R. O.) region of a semiconductor substrate. An edge roll off region occurs following a surface treatment (CMP treatment) of the semiconductor substrate. The edge roll off region of the semiconductor substrate has a smaller thickness than the center region of the semiconductor substrate, and bonding is not performed in the edge roll off region when manufacturing an SOI substrate. As a result, the projecting portion 126 remains in the edge roll off region of the semiconductor substrate 121.

Note that in the region of the semiconductor substrate 121 other than the projecting portion 126 (especially, the region surrounded by the edge roll off region), there is a semiconductor region 129. The semiconductor region 129 is formed in such a manner that a region irradiated with an ion, which is formed in the semiconductor substrate 121 during the manufacturing process of an SOI substrate, is left after the semiconductor layer is separated.

Here, the semiconductor region 129 is sufficiently thin as compared to the semiconductor region in the projecting portion 126 (the semiconductor region 125 and the semiconductor region 127). The semiconductor region 129 is also damaged by the ion irradiation treatment and the like, and includes many crystal defects and the like. Therefore, the semiconductor region 129 can be called a damaged semiconductor region like the semiconductor region 125 and the semiconductor region 127.

Figure 1B:
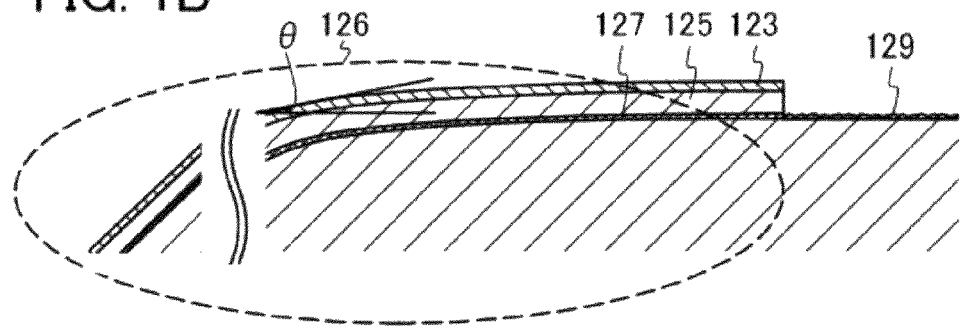

FIG. 1B shows a schematic view in which the projecting portion 126 is enlarged. The projecting portion 126 includes a region corresponding to the edge roll off region and a region corresponding to a chamfer portion. In this embodiment, the edge roll off region means a set of points at which angle θ between a tangent plane of the surface of the projecting portion 126 and a reference plane is 0.5 degrees or less. Here, as the reference plane, the plane which is parallel to the surface or the back surface of the semiconductor substrate is employed.

Further, when the chamfer portion is a region at a distance of approximately 0.2 mm from the end of the substrate, the edge roll off region can be defined as a region which is inside the chamfer portion and in which bonding is not performed. Specifically, a region at a distance of approximately 0.2 mm to 0.9 mm from the end of the substrate can be called the edge roll off region, for example.

Note that because the chamfer portion does not affect the bonding between the base substrate and the bond substrate, the planarity of the chamfer portion does not matter in the reprocessing treatment of the substrate. On the other hand, the vicinity of the edge roll off region has an influence on the bonding between the base substrate and the bond substrate. Therefore, a reprocessed semiconductor substrate may not be used for the manufacturing process of an SOI substrate, depending on the planarity of the edge roll off region. From such a reason, to remove the projecting portion 126 in the edge roll off region to improve the planarity is quite important in the reprocessing treatment of the semiconductor substrate.

Figure 1C:
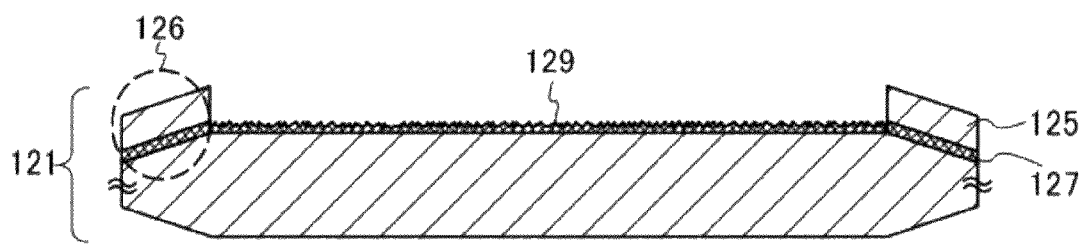
Figure 1D:
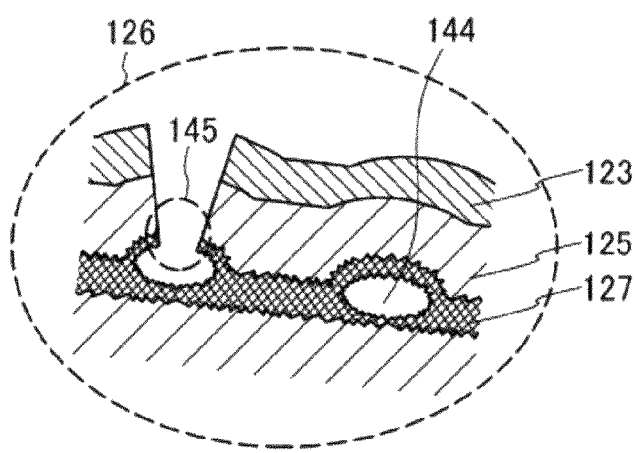

Further, FIG. 1D shows a schematic view in which a part of the projecting portion 126 is enlarged. The unseparated semiconductor region 125 and the semiconductor region 127 are both damaged by the ion irradiation treatment or the like in the manufacturing process of an SOI substrate, and include many crystal defects, voids, a blister 144, and the like. The region 145 surrounded by a dotted line shows the state where the semiconductor layer and an insulating film over the blister are damaged. The surface of the insulating layer 123 has much roughness due to the blister and the like.

The reprocessing treatment of the semiconductor substrate includes not less than two etching treatments: an etching treatment for removing the insulating layer 123 (hereinafter, referred to as a first etching treatment) and an etching treatment for removing the damaged semiconductor region (hereinafter, referred to as a second etching treatment). In addition, in the second etching treatment, an etching treatment for removing a partly remaining first oxide film is performed, a second oxide film is formed on the whole surface of the semiconductor substrate, and the second oxide film is removed and the surface of the semiconductor substrate is polished. Hereinafter, these treatments are described in detail.

First, the first etching treatment is described with reference to FIG. 1C. The first etching treatment is an etching treatment for removing the insulating layer 123 from the semiconductor substrate 121, as described above. Here, the insulating layer 123 can be removed by a wet etching treatment using a solution including hydrofluoric acid as an etchant. As the solution including hydrofluoric acid, a solution including hydrofluoric acid, ammonium fluoride, and a surfactant (e.g., product name: LAL 500 manufactured by Stella Chemifa Corporation), or the like is preferably used. The wet etching treatment is preferably performed for 120 seconds to 1200 seconds, for example, approximately 600 seconds.

Note that the wet etching treatment can be performed by soaking the semiconductor substrate 121 with a solution in a treatment tank, so that a plurality of semiconductor substrates 121 can be processed at one time. Thereby, the reprocessing treatment can be performed more efficiently. Further, by removing the insulating layer 123 by the first etching treatment, there is no need to remove the insulating layer 123 by the second etching treatment, so that the etching time can be shortened. Moreover, since a semiconductor is hardly etched in the first etching treatment, the amount of semiconductor removed from the semiconductor substrate 121 by etching can be reduced and the number of times of reprocessing can be increased.

In the first etching treatment, at least the insulating layer 123 needs to be removed and a dry etching treatment may be used. Further, the combination of the wet etching treatment and the dry etching treatment may be used. As the dry etching treatment, a parallel plate reactive ion etching (RIE) method, an inductively coupled plasma (ICP) etching method, and the like can be used.

Figure 2A:
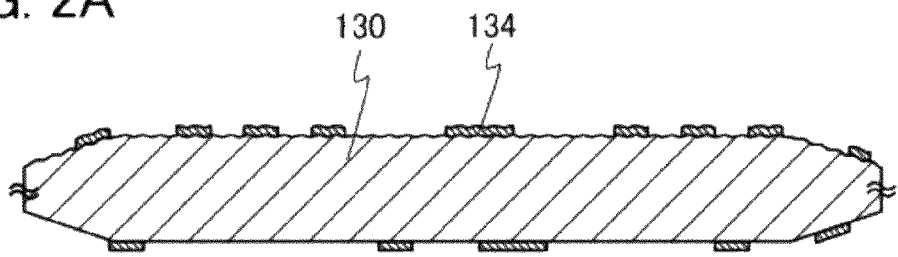
FIGS. 2A to 2D are cross-sectional views showing a method for reprocessing a semiconductor substrate.

Next, the second etching treatment is described with reference to FIG. 2A. In the second etching treatment, the damaged semiconductor region, that is, the unseparated semiconductor region 125 and the semiconductor region 127 which are included in the projecting portion 126, and the semiconductor region 129 are selectively removed. More specifically, the wet etching treatment is performed using, as an etchant, a solution including a substance that oxidizes a semiconductor material, a substance that dissolves an oxidized semiconductor material, and a substance that controls the speed of oxidation of the semiconductor material and the speed of dissolution of the oxidized semiconductor material. The second etching treatment is preferably performed for approximately 1 minute to 10 minutes, for example, approximately 2 minutes to 4 minutes. Further, the temperature of the solution is preferably approximately 10° C. to 30° C., for example, 25° C.

In the above, as the substance oxidizing the semiconductor material, nitride acid is preferably used. Further, as the substance dissolving the oxidized semiconductor material, hydrofluoric acid is preferably used. Moreover, as the substance controlling the speed of oxidation of the semiconductor material and the speed of dissolution of the oxidized semiconductor material, acetic acid is preferably used. Here, it is preferable to use as an etchant a solution having a composition obtained by adjusting the volume of 70 weight % nitric acid to more than 0.01 times and less than one time as large as that of 97.7 weight % acetic acid and to more than 0.1 times and less than 100 times as large as that of 50 weight % hydrofluoric acid, and further adjusting the volume of 50 weight % hydrofluoric acid to more than 0.01 times and less than 0.5 times as large as that of 97.7 weight % acetic acid. For example, an appropriate volume ratio of hydrofluoric acid, nitride acid and acetic acid may be 1:3:10. When the volume ratio is expressed as a molar ratio of molecules, $HF:HNO_3:CH_3COOH:H_2O=2.1:3.3:12:7.5$. Note that there is no particular limitation on the structure of the other molecules.

In the damaged semiconductor region, there are crystal defects, voids, and the like due to the ion irradiation, so that the etchant penetrates easily into the damaged semiconductor region. Thus, in the damaged semiconductor region, the wet etching treatment proceeds not only from the surface but also from the inside. Specifically, the etching tends to proceed in such a manner that a deep hole is formed in a direction perpendicular to the plane surface of the substrate and the hole is expanded. That is, in the damaged semiconductor region, the etching treatment proceeds at a higher etching rate than in a less-damaged semiconductor region or a non-damaged semiconductor region. Here, the etching rate means the etching amount (the amount etched) per unit of time. That is, "etching rate is high" means that etching is performed easily, whereas "etching rate is low" means that etching is difficult to be performed. Further, "to have etching selectivity" means that, for example, in performing etching of a layer A and a layer B, the etching rate of the layer A and the etching rate of the layer B are sufficiently different from each other. Moreover, the less-damaged semiconductor region means a semiconductor region in which the degree of damage is relatively low compared to that of the unseparated semiconductor region 125, the semiconductor region 127, the semiconductor region 129, and the like.

More specifically, the etching rate of the damaged semiconductor region is more than or equal to twice the etching rate of the non-damaged semiconductor region (or the less-damaged semiconductor region). That is, the etching selectivity of the damaged semiconductor region to the non-damaged semiconductor region (or the less-damaged semiconductor region) is more than or equal to 2.

In such a manner, when the wet etching treatment is performed using, as an etchant, the solution which includes the substance oxidizing the semiconductor material, the substance dissolving the oxidized semiconductor material, and the substance controlling the speed of oxidation of the semiconductor material and the speed of dissolution of the oxidized semiconductor material, the damaged semiconductor region can be selectively removed. Therefore, the amount of semiconductor removed in the reprocessing treatment can be reduced, and the number of times of reprocessing and use can be increased. Further, by using the wet etching treatment, a plurality of semiconductor substrates 121 can be processed at one time, so that the reprocessing treatment can be performed more efficiently. Moreover, the second etching treatment can be performed in short time; thus, the efficiency of the reprocessing treatment can be increased also for this reason.

Note that the thickness of the damaged semiconductor region in the projecting portion 126 (the semiconductor region 125 and the semiconductor region 127) is greatly different from the thickness of the damaged semiconductor region in the other region (the semiconductor region 129). Thus, the etching selectivity of the projecting portion 126 (the periphery) to the other region (the central portion) is not constant during the second etching treatment.

A more specific description follows. First, because both of the damaged semiconductor regions in the projecting portion 126 and in the other region are etched just after the second etching treatment is started, the etching selectivity is approximately 1. Next, after the damaged semiconductor region other than the projecting portion 126 (the semiconductor substrate 129) is removed, the less-damaged semiconductor region or the non-damaged semiconductor region appears in the region other than the projecting portion 126, so that the damaged semiconductor region in the projecting portion 126 is removed preferentially and the etching selectivity becomes more than or equal to 2. Then, after the damaged semiconductor region in the projecting portion 126 (the semiconductor region 125 and the semiconductor region 127) is etched to be removed, the less-damaged semiconductor region or the non-damaged semiconductor region appears also in the region, so that the etching selectivity becomes approximately 1.

In such a manner, the etching selectivity is changed during the second etching treatment, whereby the etching can be completed in accordance with this. For example, by stopping the etching treatment when the etching selectivity is decreased to less than 2, the damaged semiconductor region can be removed while the amount of semiconductor removed in the second etching treatment is reduced. In this case, the reprocessing treatment can be performed certainly, and a sufficient number of times of reprocessing can be secured. Note that the etching selectivity may be a value (a finite difference value) obtained by comparing the amounts of thickness reduced in a predetermined time (for example, 30 seconds or 1 minute) or may be a value (a differential value) obtained by comparing the amounts of thickness reduced in an instant.

From the above, a semiconductor substrate 130 from which the semiconductor region 125, the semiconductor region 127 and the semiconductor region 129 are removed is formed. Here, the semiconductor substrate 130 does not have sufficient planarity, and thus, a polishing treatment such as the CMP method is performed in a later process. Further, on the surface of the semiconductor substrate 130, a first oxide film 134 partly remains in some cases as is shown in FIG. 2A. This is because, in the second etching treatment, the etching treatment is completed in the process where the oxide film including the substance oxidizing the semiconductor material is dissolved in the substance dissolving the oxidized semiconductor material, so that the oxide film which is not dissolved partly remains on the surface of the semiconductor substrate 130 as the first oxide film 134.

When the polishing treatment such as the CMP method is performed to flatten the reprocessed semiconductor substrate in the later process, the surface of the semiconductor substrate 130 cannot be evenly polished due to a difference in the polishing rate between the semiconductor substrate 130 and the first oxide film 134, so that unevenness (roughness) corresponding to the first oxide film 134 is formed on the surface of the reprocessed semiconductor substrate and sufficient planarity of the reprocessed semiconductor substrate cannot be obtained.

Further, since the semiconductor substrate 130 which has a water repellent property is partly exposed, when moisture sticks to the exposed portion, a reaction product called a watermark is formed and unevenness (roughness) is formed on the surface of the semiconductor substrate 130; thus, sufficient planarity of the reprocessed semiconductor substrate cannot be obtained.

Therefore, in this embodiment, the reprocessed semiconductor substrate is manufactured as follows: after removing the first oxide film 134 which partly remains on the surface of the semiconductor substrate 130, a second oxide film 135 which has a hydrophilic property is formed on the whole surface of the semiconductor substrate 130, and the second oxide film 135 is removed and the surface of the semiconductor substrate 130 is polished. Note that the removal of the first oxide film 134, the formation of the second oxide film 135, the removal of the second oxide film 135, and the polishing treatment on the surface of the semiconductor substrate 130 may be performed at least on the surface of the reprocessed semiconductor substrate whose planarity needs to be improved, and do not necessarily need to be performed on the whole surface of the semiconductor substrate 130.

Figure 2B:
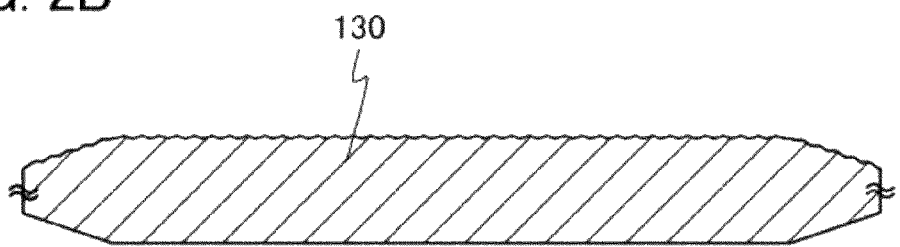

First, an etching treatment for removing the first oxide film 134 partly remaining on the surface of the semiconductor substrate 130 is described with reference to FIG. 2B. The etching treatment for removing the first oxide film 134 is performed in a manner similar to that in the above described first etching treatment. Therefore, the first oxide film 134 can be removed by a wet etching treatment using, as an etchant, a solution including hydrofluoric acid, more preferably an aqueous solution including hydrofluoric acid. Here, the concentration of the aqueous solution including hydrofluoric acid is preferably from 0.1% to 50%, for example, approximately 0.5%. The wet etching treatment is preferably performed for approximately 1 second to 60 seconds, for example, approximately 6 seconds.

The first oxide film 134 can be removed in this manner, so that there are no portions on the semiconductor substrate 130 whose polishing rates are different from each other, when the polishing treatment such as the CMP method is performed in the later process. Therefore, the polishing treatment is evenly performed on the surface of the semiconductor substrate 130, so that the reprocessed semiconductor substrate having sufficient planarity can be formed.

As the etching treatment for removing the first oxide film 134, at least the first oxide film 134 needs to be removed, and a dry etching treatment can also be used. Further, the combination of the wet etching treatment and the dry etching treatment can be used. As the dry etching treatment, a parallel plate reactive ion etching (RIE) method, an inductively coupled plasma (ICP) etching method, and the like can be used.

Note that the etching treatment for removing the first oxide film 134 does not necessarily need to be performed and the second oxide film 135 may be formed on the whole surface of the semiconductor substrate 130 while the first oxide film 134 remains.

Figure 2C:
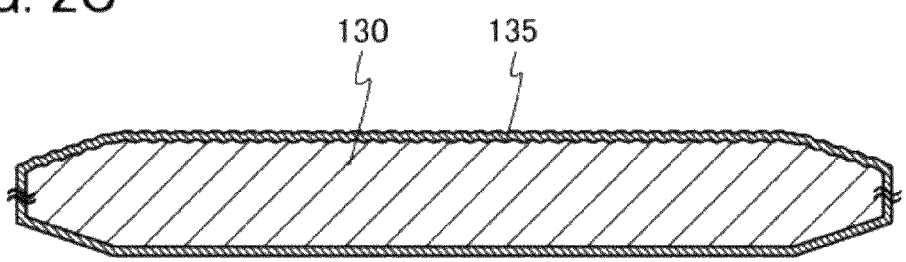

Next, the process for forming the second oxide film 135 on the surface of the semiconductor substrate 130 is described with reference to FIG. 2C. The second oxide film 135 can be formed by treating the surface of the semiconductor substrate 130 with an aqueous solution including ozone. Here, the second oxide film 135 is a thin oxide film with a thickness of from 1 nm to 10 nm, preferably from approximately 2 nm to 5 nm. Here, the concentration of the aqueous solution including ozone which is used for forming the second oxide film 135 is preferably from 5 ppm to 100 ppm, for example, approximately 10 ppm. The treatment with the aqueous solution including ozone is preferably performed for approximately 5 seconds to 1000 seconds, for example, approximately 20 seconds.

Accordingly, the second oxide film 135 which has a hydrophilic property can be formed to cover the whole surface of the semiconductor substrate 130. Thus, when the polishing treatment such as the CMP method is performed in the later process, there are no portions on the surface of the second oxide film 135 and on the surface of the semiconductor substrate 130 whose polishing rates are different from each other. Therefore, the removal of the second oxide film 135 and the polishing of the surface of the semiconductor substrate 130 can be performed evenly, so that a reprocessed semiconductor substrate having sufficient planarity can be formed. Further, since the second oxide film 135 has a hydrophilic property, generation of watermarks can be prevented and no unevenness (roughness) is formed on the surface of the second oxide film 135, and the reprocessed semiconductor substrate having sufficient planarity can be formed.

Note that, in case of forming the second oxide film 135 without removing the first oxide film 134, the second oxide film 135 can be formed on the exposed portion of the semiconductor substrate 130, and the second oxide film 135 can be formed so as to cover the whole surface of the semiconductor substrate 130.

Further, after the second oxide film 135 is formed, the second oxide film 135 may be removed, and another oxide film may be formed. Moreover, the removal of an oxide film and the formation of another oxide film may be repeated plural times. Accordingly, the planarity of the oxide film which is formed on the semiconductor substrate 130 is improved, so that a reprocessed semiconductor substrate having more favorable planarity can be manufactured. Further, in case of removing an oxide film and forming another oxide film, if the total treatment time is the same, repeating a short time treatment in many cycles is more preferable than repeating a long time treatment in few cycles because an even oxide film can be formed efficiently. Moreover, by repeating the removal of the oxide film and the formation of another oxide film, particles and metal impurities attached on the surface of the semiconductor substrate 130 can be removed, which prevents the contamination of the semiconductor substrate 130 and of the equipment used to process the semiconductor substrate 130.

Figure 2D:
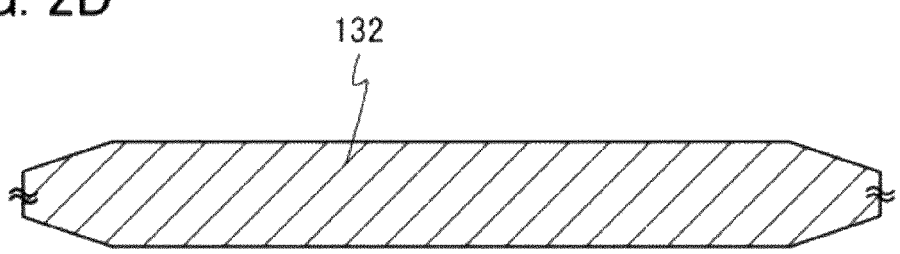

Next, a polishing treatment such as the CMP method is performed on the surface of the second oxide film 135, and the surface of the semiconductor substrate 130 is exposed and the surface of the semiconductor substrate 130 is planarized, so that a reprocessed semiconductor substrate 132 is manufactured (see FIG. 2D). This is because, in case where the planarity of the surface of the semiconductor substrate 130 is insufficient after the second etching treatment, the semiconductor substrate cannot be used for the manufacturing process of an SOI substrate. Note that this embodiment shows the case where the semiconductor region 129 is completely removed by the second etching treatment is shown; however, in the case where the semiconductor region 129 is removed insufficiently by the second etching treatment, the remaining semiconductor region 129 is preferably removed by a planarization treatment as described below.

As a polishing treatment for removing the second oxide film 135 and planarizing the semiconductor substrate 130, chemical mechanical polishing (CMP) method is preferably used. Here, the CMP method is a method by which the surface of an object is planarized by a combination of chemical and mechanical actions. For example, the CMP method is performed in the following manner: a polishing cloth is attached to a polishing stage, and the stage and the object are each rotated or vibrated while supplying a slurry (an abrasive) between the object and the polishing cloth. Accordingly, by a chemical reaction between the slurry and the surface of the object and by the action of mechanical polishing of the object with the polishing cloth, the surface of the object is polished.

The number of times of the polishing treatment using the CMP method may be one or more. When the polishing treatment is performed plural times, for example, first polishing is preferably performed with a high polishing rate followed by final polishing with a low polishing rate. At the first polishing, a polyurethane polishing cloth is preferably used, and the grain diameter of the slurry is preferably 120 nm to 180 nm, for example, approximately 150 nm. At the final polishing, a suede polishing cloth is preferably used, and the grain diameter of the slurry is preferably 45 nm to 75 nm, for example, approximately 60 nm.

Further, in addition to the polishing treatment, laser light irradiation treatment can be performed. There is no limitation on the number of times of the polishing treatment and the laser irradiation treatment, and the polishing treatment and laser light irradiation treatment may be performed in combination. Instead of laser light irradiation treatment, lamp light irradiation treatment can also be performed.

Accordingly, the reprocessed semiconductor substrate 132 which is planarized to have a surface average roughness of from approximately 0.2 nm to 0.5 nm can be formed by subjecting the semiconductor substrate 130 to the polishing treatment using the CMP method in addition to the above reprocessing method. Further, by performing the polishing treatment a plurality of times at different polishing rates, the semiconductor substrate 130 can be planarized in a short time.

As described in this embodiment, after removing an insulating layer by the first etching treatment, the second etching treatment is performed using the solution including the substance oxidizing a semiconductor material, the substance dissolving the oxidized semiconductor material, and the substance controlling the speed of oxidation of the semiconductor material and the speed of dissolution of the oxidized semiconductor material, so that the damaged semiconductor region remaining in the periphery of the semiconductor substrate can be selectively removed. Therefore, the amount of semiconductor removed can be reduced, and the number of times of reprocessing and reusing of the semiconductor substrate can be increased.

Further, after removing the semiconductor region 125, the semiconductor region 127 and the semiconductor region 129 by the first etching treatment and the second etching treatment, the first oxide film 134 partly remaining on the surface of the semiconductor substrate 130 is removed, and the second oxide film 135 is formed on the surface of the semiconductor substrate 130. Then, the second oxide film 135 is removed by the polishing treatment such as the CMP method, so that the semiconductor substrate 130 is polished evenly at a uniform rate, whereby the reprocessed semiconductor substrate 132 having more favorable planarity can be obtained.

Note that the structure shown in this embodiment can be combined as appropriate with any structure shown in the other embodiments.

Embodiment 2

In a method for manufacturing an SOI substrate of this embodiment, an SOI substrate is manufactured by bonding a semiconductor layer separated from a semiconductor substrate, corresponding to a bond substrate, to a base substrate. The semiconductor substrate from which the semiconductor layer has been separated is subjected to the reprocessing treatment and reused as a bond substrate. An example of a method for manufacturing the SOI substrate of this embodiment will be described below with reference to FIGS. 3A to 3C, FIGS. 4A to 4C, FIGS. 5A to 5C, and a manufacturing process chart of an SOI substrate of FIG. 6.

First, a process of forming an embrittlement region 104 in a semiconductor substrate 100 to prepare for bonding with a base substrate 120 is described. This process relates to a treatment for the semiconductor substrate 100 and corresponds to Process A in FIG. 6.

Figure 3A:
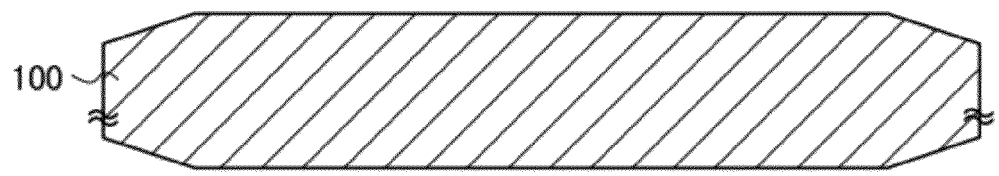
FIGS. 3A to 3C are cross-sectional views showing a method for manufacturing an SOI substrate.
Figure 6:
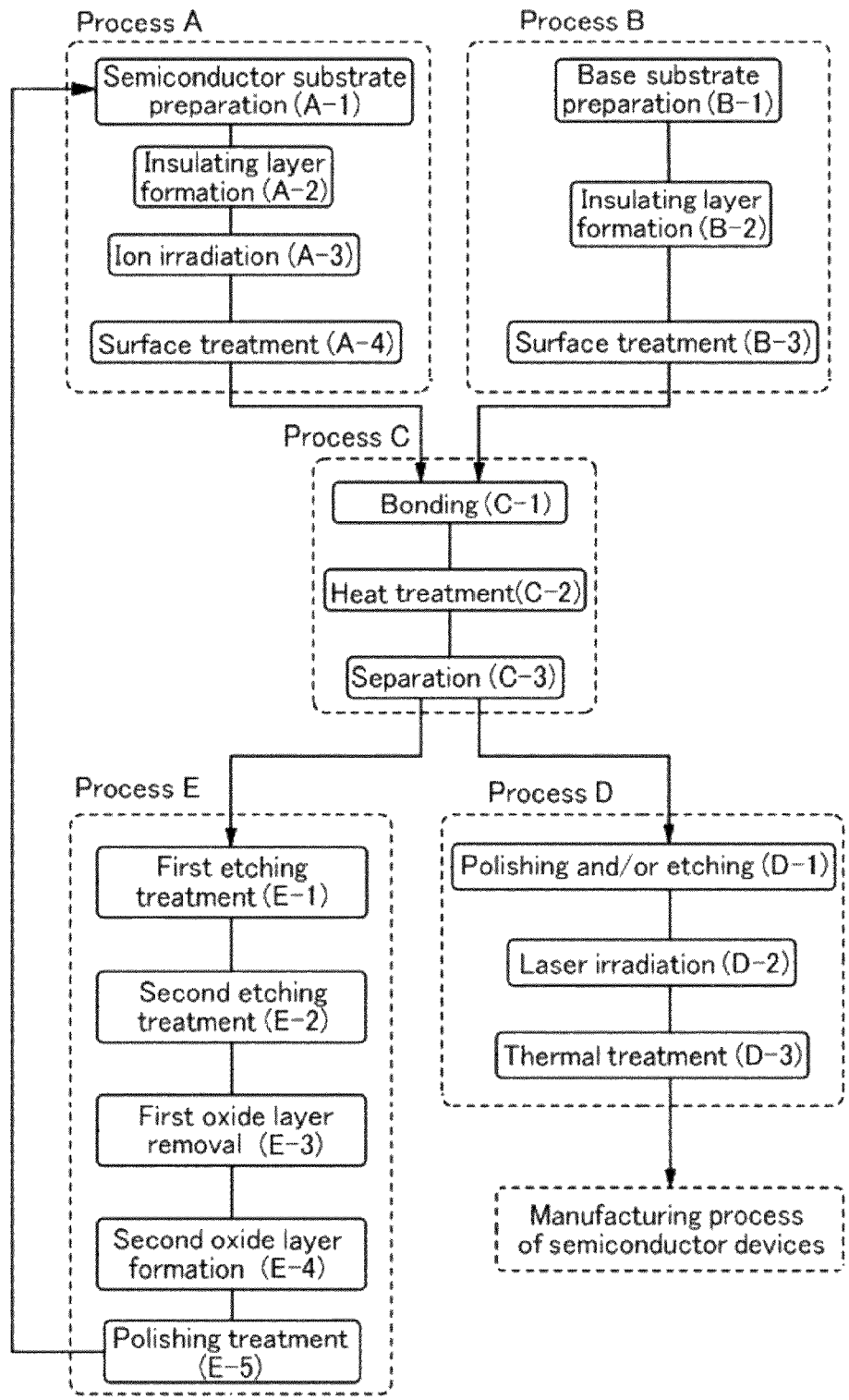
FIG. 6 is a view showing a manufacturing process of an SOI substrate.

First, the semiconductor substrate 100 is prepared (see FIG. 3A and the step A-1 in FIG. 6). As the semiconductor substrate 100, for example, a single crystal semiconductor substrate or a polycrystalline semiconductor substrate of silicon or the like can be used. Typical examples of commercially available silicon substrates include circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Further, in the periphery of a silicon substrate, there is a chamfer portion for preventing chipping or cracking as shown in FIG. 3A. Note that the shape is not limited to the circular shape, and a silicon substrate which is processed into a rectangular shape or the like can also be used. The case where a rectangular single crystal silicon substrate is used as the semiconductor substrate 100 is described below.

Note that a surface of the semiconductor substrate 100 is preferably cleaned using a sulfuric acid/hydrogen peroxide mixture (SPM), an ammonium hydroxide/hydrogen peroxide mixture (APM), a hydrochloric acid/hydrogen peroxide mixture (HPM), dilute hydrofluoric acid (DHF), a solution of hydrofluoric acid, hydrogen peroxide water, and pure water (FPM), or the like, as appropriate. Further, dilute hydrofluoric acid and ozone water may be used alternately to clean the surface of the semiconductor substrate 100.

Figure 3B:
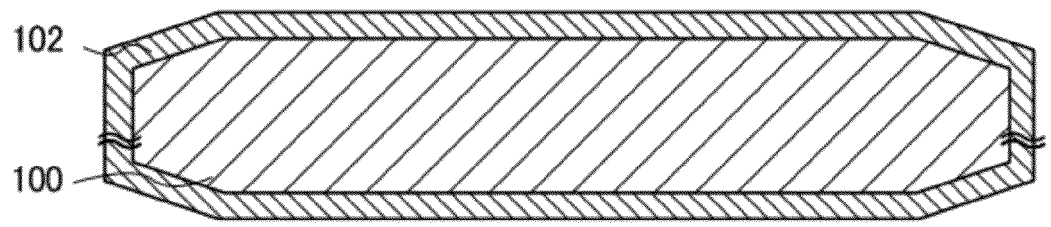
Figure 3C:
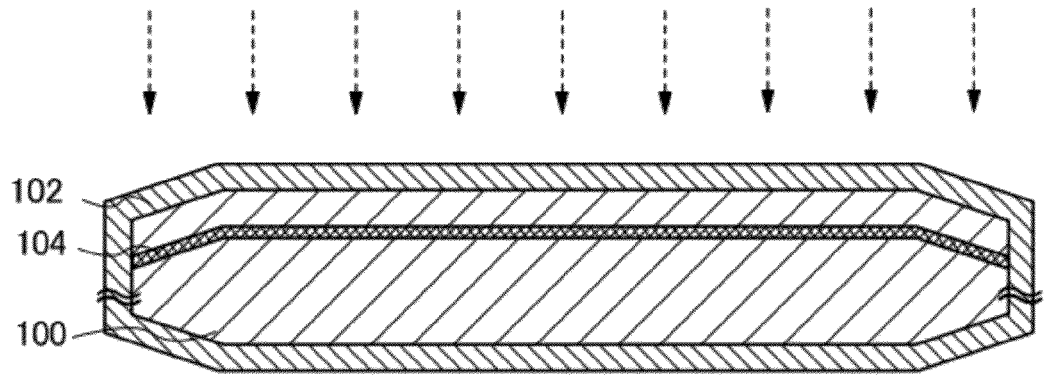

After the surface of the semiconductor substrate 100 is cleaned, an insulating layer 102 is formed on the semiconductor substrate 100 (see FIG. 3B and the step A-2 in FIG. 6). The insulating layer 102 may be formed using a single insulating film or a stacked layer including a plurality of insulating films. The insulating layer 102 can be formed using an insulating film which contains silicon as a component, such as a silicon oxide film, a silicon nitride film, a silicon oxynitride film, or a silicon nitride oxide film. In this embodiment, the case of using a silicon oxide film as the insulating layer 102 is described as an example.

Note that in this specification or the like, a silicon oxynitride film refers to a film that contains more oxygen atoms than nitrogen atoms, and contains oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively, when they are measured by Rutherford backscattering spectrometry (RBS) and hydrogen forward scattering spectrometry (HFS). Further, a silicon nitride oxide film refers to a film that contains more nitrogen atoms than oxygen atoms, and contains oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively, when they are measured by RBS and HFS. Note that percentages of nitrogen, oxygen, silicon, and hydrogen fall within the ranges given above when the total number of atoms contained in the silicon oxynitride film or the silicon nitride oxide film is defined as 100 atomic %.

In the case of using a silicon oxide film as the insulating layer 102, the insulating layer 102 can be formed by a vapor deposition method such as a thermal CVD method, a plasma CVD method, an atmospheric pressure CVD method, or a bias ECRCVD method using a mixed gas of silane and oxygen, a mixed gas of tetraethoxysilane (TEOS) and oxygen, or the like. In this case, a surface of the insulating layer 102 may be densified by an oxygen plasma treatment.

Alternatively, a silicon oxide film deposited by a chemical vapor deposition method using an organosilane gas may be used as the insulating layer 102. As the organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

Further alternatively, the insulating layer 102 can be formed using an oxide film obtained by oxidizing the semiconductor substrate 100. A thermal oxidation treatment for forming the oxide film may be dry oxidation, and may be performed in an oxidation atmosphere to which a halogen-containing gas is added. As the halogen-containing gas, one or plural kinds of gases selected from HCl, HF, $NF_3$, HBr, $Cl_2$, $ClF_3$, $BCl_3$, $F_2$, $Br_2$, and the like can be used. Note that the insulating layer 102 is formed to cover the semiconductor substrate 100 in FIG. 3B; however, this embodiment is not limited to this structure. In the case where the insulating layer 102 is formed by a CVD method or the like on the semiconductor substrate 100, the insulating layer 102 may be formed on only one of the surfaces of the semiconductor substrate 100.

As an example of formation conditions of the thermal oxide film, a heat treatment is performed at higher than or equal to 700° C. and lower than or equal to 1100° C. (typically at approximately 950° C.) in an atmosphere containing HCl at a rate of 0.5 volume % to 10 volume % (preferably 3 volume %) with respect to oxygen. The treatment time may be 0.1 hour to 6 hours, preferably 0.5 hour to 1 hour. The thickness of the oxide film to be formed can be set in the range of 10 nm to 1100 nm (preferably 50 nm to 150 nm), for example, 100 nm.

By such a thermal oxidation treatment in an atmosphere containing a halogen element, the oxide film can contain the halogen element. By containing the halogen element at a concentration of $1 \times 10^{17}$ atoms/cm$^3$ to $1 \times 10^{21}$ atoms/cm$^3$, the oxide film captures heavy metal that is an extrinsic impurity (e.g., Fe, Cr, Ni, or Mo), so that contamination of the semiconductor layer to be formed later can be prevented.

Further, the insulating layer 102 containing a halogen element such as chlorine can serve to getter impurities (e.g., mobile ions of Na or the like) which adversely affect the semiconductor substrate 100. Specifically, by a heat treatment which is performed after the insulating layer 102 is formed, impurities contained in the semiconductor substrate 100 are separated out to the insulating layer 102, reacted with the halogen atom (e.g., a chlorine atom), and captured. Accordingly, the impurities captured in the insulating layer 102 can be fixed and prevented from contaminating the semiconductor substrate 100. Further, when the insulating layer 102 is bonded to a glass substrate, the insulating layer 102 can also function as a film for fixing impurities such as Na contained in glass.

In particular, the inclusion of halogen such as chlorine in the insulating layer 102 by the heat treatment in an atmosphere containing halogen is effective in removing contaminants of the semiconductor substrate when cleaning of the semiconductor substrate 100 is insufficient or when the semiconductor substrate 100 is repeatedly subjected to the reprocessing treatment and used.

Moreover, the halogen element contained in the oxidation treatment atmosphere terminates defects on the surface of the semiconductor substrate 100; as a result, the local level density of an interface between the oxide film and the semiconductor substrate 100 can be reduced.

The halogen element contained in the insulating layer 102 makes distortions in the insulating layer 102. As a result, water absorption rate of the insulating layer 102 is improved and diffusion rate of water is increased. That is, when water is present on the surface of the insulating layer 102, the water present on the surface can be rapidly absorbed and diffused into the insulating layer 102.

In the case of using, as a base substrate, a glass substrate which contains impurities which decrease reliability of a semiconductor device, such as alkali metal or alkaline earth metal, the insulating layer 102 preferably includes at least one or more films which can prevent the impurities in the base substrate from diffusing into the semiconductor layer of the SOI substrate. Examples of such a film include a silicon nitride film, a silicon nitride oxide film, and the like. With such a film included in the insulating layer 102, the insulating layer 102 can function as a barrier film (also referred to as a blocking film).

For example, a silicon nitride film can be formed using a mixed gas of silane and ammonium by a vapor deposition method such as a plasma CVD method. In addition, for example, a silicon nitride oxide can be formed using a mixed gas of silane, ammonia, and dinitrogen monoxide by a vapor deposition method such as a plasma CVD method.

For example, in the case of forming a barrier film having a single-layer structure as the insulating layer 102, the insulating layer 102 can be formed using a silicon nitride film or a silicon nitride oxide film with a thickness of greater than or equal to 15 nm and less than or equal to 300 nm.

In the case of forming a two-layer barrier film as the insulating layer 102, the upper layer is formed using an insulating film with a high barrier property. An insulating film of the upper layer can be formed using, for example, a silicon nitride film or a silicon nitride oxide film having a thickness of 15 nm to 300 nm. These films have a high blocking effect for preventing impurity diffusion, but their internal stress is also high. Therefore, as an insulating film of the lower layer that is in contact with the semiconductor substrate 100, a film that has an effect of relieving the stress of the insulating film of the upper layer is preferably selected. As the insulating film with an effect of relieving the stress of the insulating film of the upper layer, a silicon oxide film, a silicon oxynitride film, a thermal oxide film formed by thermally oxidizing the semiconductor substrate 100, and the like are given. The thickness of the insulating film of the lower layer can be greater than or equal to 5 nm and less than or equal to 200 nm.

For example, in order for the insulating layer 102 to function as a barrier film, the insulating layer 102 is preferably formed using a combination of a silicon oxide film and a silicon nitride film, a silicon oxynitride film and a silicon nitride film, a silicon oxide film and a silicon nitride oxide film, a silicon oxynitride film and a silicon nitride oxide film, or the like.

Next, the semiconductor substrate 100 is irradiated with an ion beam containing ions accelerated by an electric field through the insulating layer 102, as indicated by arrows. Thus, the embrittlement region 104 is formed in a region at a desired depth from the surface of the semiconductor substrate 100 (see FIG. 3C and the step A-3 in FIG. 6). The depth at which the embrittlement region 104 is formed is substantially the same as the average penetration depth of the ions, and can be adjusted by the acceleration energy of the ion beam and the incident angle of the ion beam. In addition, the acceleration energy can be adjusted by acceleration voltage, dosage, or the like. The thickness of a semiconductor layer 124 which is separated from the semiconductor substrate 100 later is determined by the depth at which the embrittlement region 104 is formed. The depth at which the embrittlement region 104 is formed can be set in the range of, for example, greater than or equal to 10 nm and less than or equal to 500 nm, preferably greater than or equal to 50 nm and less than or equal to 200 nm from the surface of the semiconductor substrate 100; for example, the depth is preferably approximately 100 nm from the surface of the semiconductor substrate 100. Note that irradiation with ions is performed after formation of the insulating layer 102 in this embodiment; however, without being limited thereto, the irradiation with ions may be performed before the formation of the insulating layer 102.

The embrittlement region 104 can be formed by an ion doping treatment. The ion doping treatment can be performed with an ion doping apparatus. A typical example of an ion doping apparatus is a non-mass-separation apparatus with which an object placed in a chamber is irradiated with all ion species generated by excitation of a process gas into plasma. The non-mass-separation apparatus is an apparatus with which an object is irradiated with all ion species without mass separation of ion species in plasma.

Main components of an ion doping apparatus are as follows: a chamber in which an object is placed; an ion source for generating desired ions; and an acceleration mechanism for acceleration of ions for irradiation therewith. The ion source includes a gas supply device which supplies a source gas to generate desired ion species, an electrode for exciting the source gas to generate plasma, and the like. As the electrode for generating plasma, a capacitively-coupled high-frequency discharge electrode, a filament electrode, or the like is used. The acceleration mechanism includes electrodes such as an extraction electrode, an acceleration electrode, a deceleration electrode, and a ground electrode; a power source for supplying power to these electrodes; and the like. These electrodes included in the acceleration mechanism are provided with a plurality of openings or slits, through which ions that are generated from the ion source are accelerated. Note that components of the ion doping apparatus are not limited to those described above and may be changed as needed.

In this embodiment, the case where the semiconductor substrate 100 is irradiated with ions generated from a hydrogen gas by using an ion doping apparatus is described. A hydrogen-containing gas such as $H_2$ is supplied as a plasma source gas. A hydrogen gas is excited to generate plasma, ions contained in plasma are accelerated without mass separation, and the semiconductor substrate 100 is irradiated with the accelerated ions.

In the above ion addition treatment, the percentage of $H_3^-$ ions to the total amount of ion species ($H^+$, $H_2^+$, and $H_3^-$) that are generated from a hydrogen gas is set to 50% or higher. Preferably, the percentage of $H_3^+$ ions is set to 80% or higher. This is because the semiconductor substrate 100 can be efficiently irradiated with hydrogen ions by increasing the percentage of $H_3^+$ ions in plasma. Note that the mass of an $H_3^-$ ion is three times as large as that of an $H^+$ ion; therefore, when one hydrogen atom is added to a depth, the acceleration voltage for an $H_3^+$ ion can be three times as high as that of an $H^+$ ion. For this reason, the takt time in the ion irradiation step can be shortened, and productivity and throughput can be improved. By irradiation with ions having the same mass, ions can be added to the same depth in the semiconductor substrate 100 in a concentrated manner.

Ion doping apparatuses are inexpensive and excellent in use for large-area treatment. Therefore, by irradiation with $H_3^+$ ions using an ion doping apparatus, significantly large effects such as improvement in semiconductor characteristics, increase in area, reduction in cost, and improvement in productivity can be obtained. Further, in the case where an ion doping apparatus is used, heavy metal may also be introduced at the time of the ion irradiation; however, by irradiation with ions through the insulating layer 102 containing chlorine atoms, the semiconductor substrate 100 can be prevented from being contaminated by the heavy metal.

Further, the embrittlement region 104 can be formed by an ion implantation treatment using an ion implantation apparatus. The ion implantation apparatus is a mass-separation apparatus with which an object that is placed in a chamber is irradiated with a specific ion species through mass separation of a plurality of ion species that are generated by plasma excitation of a source gas. In the case of using an ion implantation apparatus, $H^+$ ions, $H_2^+$ ions, and $H_3^+$ ions which are generated by excitation of a hydrogen gas or $PH_3$ are mass-separated, and the semiconductor substrate 100 is irradiated with any of these ions.

With an ion implantation apparatus, the semiconductor substrate 100 can be irradiated with one kind of ions and ions can be added to the same depth of the semiconductor substrate 100 in a concentrated manner. Therefore, the profile of the added ions can be sharpened, and thus the surface planarity of the semiconductor layer to be separated can be easily increased. Moreover, the ion implantation apparatus is preferable because, owing to its electrode structure, contamination by heavy metal is relatively low and thus deterioration of characteristics of manufactured transistors can be suppressed.

Next, the semiconductor substrate 100 over which the insulating layer 102 is formed is cleaned. This cleaning step can be performed by ultrasonic cleaning with the use of pure water, by two-fluid jet cleaning with the use of pure water and nitrogen, or the like. The ultrasonic cleaning is preferably megahertz ultrasonic cleaning (megasonic cleaning). After the above ultrasonic cleaning or the two-fluid jet cleaning, the semiconductor substrate 100 may be further cleaned with ozone water. By the cleaning with ozone water, removal of organic substances and a surface activation treatment for improving the hydrophilic property of a surface of the insulating layer 102 can be performed.

The surface activation treatment of the insulating layer 102 can be performed by irradiation treatment with an atomic beam or an ion beam, an ultraviolet treatment, an ozone treatment, a plasma treatment, a plasma treatment with bias application, or a radical treatment instead of the cleaning with ozone water (see the step A-4 in FIG. 6). In the case of using an atomic beam or an ion beam, an inert gas neutral atom beam or an inert gas ion beam of argon or the like can be used.

Here, an example of the ozone treatment is described. For example, the ozone treatment can be performed on a surface of an object by irradiation with ultraviolet (UV) rays in an atmosphere containing oxygen. The ozone treatment in which irradiation with ultraviolet rays is performed in an atmosphere containing oxygen is also called a UV ozone treatment, an ultraviolet ozone treatment, or the like. In an atmosphere containing oxygen, irradiation with ultraviolet light having a wavelength of less than 200 nm and ultraviolet light having a wavelength of greater than or equal to 200 nm is performed, whereby ozone can be generated and singlet oxygen can be generated by ozone. In addition, irradiation with ultraviolet light having a wavelength of less than 180 nm is performed, whereby ozone can be generated and singlet oxygen can be generated by ozone.

Examples of reactions which occur by performing irradiation with light having a wavelength of less than 200 nm and light having a wavelength of greater than or equal to 200 nm in an atmosphere containing oxygen are shown below.

$$O_2 + h\nu_1(\lambda_1\ nm) \rightarrow O(^3P) + O(^3P) \quad (1)$$

$$O(^3P) + O_2 \rightarrow O_3 \quad (2)$$

$$O_3 + h\nu_2(\lambda_2\ nm) \rightarrow O(^1D) + O_2 \quad (3)$$

In the reaction formula (1), by irradiation with light ($h\nu_1$) having a wavelength ($\lambda_1$ nm) of less than 200 nm in an atmosphere containing oxygen ($O_2$), oxygen atoms ($O(^3P)$) in a ground state are generated. Then, in the reaction formula (2), the oxygen atom ($O(^3P)$) in a ground state and oxygen ($O_2$) react with each other; accordingly, ozone ($O_3$) is generated. Then, in the reaction formula (3), irradiation with light ($h\nu_2$) having a wavelength ($\lambda_2$ nm) of greater than or equal to 200 nm in an atmosphere containing generated ozone ($O_3$) is performed to generate singlet oxygen $O(^1D)$ in an excited state. In an atmosphere containing oxygen, irradiation with ultraviolet light having a wavelength of less than 200 nm is performed to generate ozone while irradiation with ultraviolet light having a wavelength of greater than or equal to 200 nm is performed to generate singlet oxygen by decomposing ozone. The ozone treatment described above, for example, can be performed by irradiation using a low-pressure mercury lamp ($\lambda_1$=185 nm, $\lambda_2$=254 nm) in an atmosphere containing oxygen.

In addition, examples of reactions which occur by performing irradiation with light having a wavelength of less than 180 nm in an atmosphere containing oxygen are shown.

$$O_2 + h\nu_3(\lambda_3\ nm) \rightarrow O(^1D) + O(^3P) \quad (4)$$

$$O(^3P) + O_2 \rightarrow O_3 \quad (5)$$

$$O_3 + h\nu_3(\lambda_3\ nm) \rightarrow O(^1D) + O_2 \quad (6)$$

In the above reaction formula (4), irradiation with light ($h\nu_3$) having a wavelength ($\lambda_3$ nm) of less than 180 nm in an atmosphere containing oxygen ($O_2$) is performed to generate singlet oxygen $O(^1D)$ in an excited state and an oxygen atom ($O(^3P)$) in a ground state. Next, in the reaction formula (5), an oxygen atom ($O(^3P)$) in a ground state and oxygen ($O_2$) are reacted with each other to generate ozone ($O_3$). In the reaction formula (6), irradiation with light ($h\nu_3$) having a wavelength ($\lambda_3$ nm) of less than 180 nm in an atmosphere containing generated ozone ($O_3$) is performed to generate singlet oxygen in an excited state and oxygen. In an atmosphere containing oxygen, irradiation with ultraviolet light having a wavelength of less than 180 nm is performed to generate ozone and to generate singlet oxygen by decomposing ozone or oxygen. The ozone treatment described above, for example, can be performed by irradiation using a Xe excimer UV lamp ($\lambda_3$=172 nm) in an atmosphere containing oxygen.

Chemical bonding of an organic substance attached to a surface of an object is cleaved by irradiation with the light having a wavelength of less than 200 nm, and the organic substance attached to the surface of the object or the organic substance whose chemical bonding is cleaved can be removed by oxidative decomposition with ozone or singlet oxygen generated by ozone. By performing such an ozone treatment as described above, a hydrophilic property and purity of the surface of the object can be increased, and favorable bonding can be performed.

In an atmosphere containing oxygen, ozone is generated by performing irradiation with ultraviolet rays. Ozone is effective in removal of the organic substance attached to the surface of the object. In addition, singlet oxygen is effective in removal of the organic substance attached to the surface of the object as much as or more than ozone. Ozone and singlet oxygen are examples of oxygen in active states, and collectively referred to as active oxygen. As described with the above reaction formulae and the like, since there are a reaction where ozone is generated in generating singlet oxygen and a reaction where singlet oxygen is generated by ozone, such reactions including a reaction to which singlet oxygen contributes are referred to as the ozone treatment here for convenience.

Next, a process of preparing for bonding the base substrate 120 to the semiconductor substrate 100 is described. This process relates to a treatment for the base substrate 120 and corresponds to Process B in FIG. 6.

First, the base substrate 120 is prepared (see the step B-1 in FIG. 6). As the base substrate 120, a variety of glass substrates used in the electronics industry, such as a substrate of aluminosilicate glass, barium borosilicate glass, or aluminoborosilicate glass; a quartz substrate; a ceramic substrate; a sapphire substrate; or the like can be used. Further, a ceramic substrate which contains silicon nitride and aluminum nitride as its main components and whose coefficient of thermal expansion is close to that of silicon may be used. In addition, as the base substrate 120, a single crystal semiconductor substrate (e.g., a single crystal silicon substrate) or a polycrystalline semiconductor substrate (e.g., a polycrystalline silicon substrate) may be used. For example, a polycrystalline silicon substrate has advantages of being less expensive than a single crystal silicon substrate and having higher heat resistance than a glass substrate.

In the case where a glass substrate is used as the base substrate 120, for example, a mother glass substrate which is developed for manufacturing liquid crystal panels is preferably used. As a mother glass substrate, substrates having the following sizes are known: the third generation (550 mm×650 mm), the 3.5-th generation (600 mm×720 mm), the fourth generation (680 mm×880 mm or 730 mm×920 mm), the fifth generation (1100 mm×1300 mm), the sixth generation (1500 mm×1850 mm), the seventh generation (1870 mm×2200 mm), the eighth generation (2200 mm×2400 mm), the ninth generation (2400 mm×2800 mm), the tenth generation (2850 mm×3050 mm), and the like. By manufacturing an SOI substrate with the use of a large-sized mother glass substrate as the base substrate 120, the SOI substrate can have a large area. Increase in the area of the SOI substrate allows many ICs to be manufactured all at once, and thus the number of semiconductor devices manufactured from one substrate is increased; therefore, productivity can be dramatically increased.

Further, an insulating layer 122 is preferably formed on the base substrate 120 (see the step B-2 in FIG. 6). Needless to say, the insulating layer 122 is not necessarily formed on the base substrate 120; however, by forming a silicon nitride film, a silicon nitride oxide film, an aluminum nitride film, an aluminum nitride oxide film, or the like, which functions as a barrier film, on the base substrate 120 as the insulating layer 122 for example, impurities such as alkali metal or alkaline earth metal in the base substrate 120 can be prevented from entering the semiconductor substrate 100.

Since the insulating layer 122 is used as a bonding layer, a surface of the insulating layer 122 is preferably planarized in order to avoid defective bonding. Specifically, the insulating layer 122 is formed to have an average surface roughness (Ra) of 0.50 nm or less and a root-mean-square roughness (Rms) of 0.60 nm or less, preferably, an average surface roughness of 0.35 nm or less and a root-mean-square roughness of 0.45 nm or less. The thickness can be set as appropriate in the range of greater than or equal to 10 nm and less than or equal to 200 nm, preferably greater than or equal to 50 nm and less than or equal to 100 nm.

A surface of the base substrate 120 is cleaned before the bonding. The surface of the base substrate 120 is preferably cleaned with a sulfuric acid/hydrogen peroxide mixture (SPM), an ammonium hydroxide/hydrogen peroxide mixture (APM), a hydrochloric acid/hydrogen peroxide mixture (HPM), dilute hydrogen fluoride (DHF), a solution of hydrofluoric acid, hydrogen peroxide water, and pure water (FPM), or the like, in a manner similar to that of the semiconductor substrate 100. Further, megahertz ultrasonic cleaning, two-fluid jet cleaning, cleaning with ozone water, or the like can be performed. In a manner similar to that of the insulating layer 102, a surface activation treatment such as irradiation treatment with an atomic beam or an ion beam, an ultraviolet treatment, an ozone treatment, a plasma treatment, a plasma treatment with bias application, or a radical treatment is preferably performed on the surface of the insulating layer 122 before the bonding (see the step B-3 in FIG. 6).

Next, a process of bonding the semiconductor substrate 100 to the base substrate 120 and separating the semiconductor substrate 100 into the semiconductor layer 124 and the semiconductor substrate 121 is described. This process corresponds to Process C in FIG. 6.

Figure 4A:
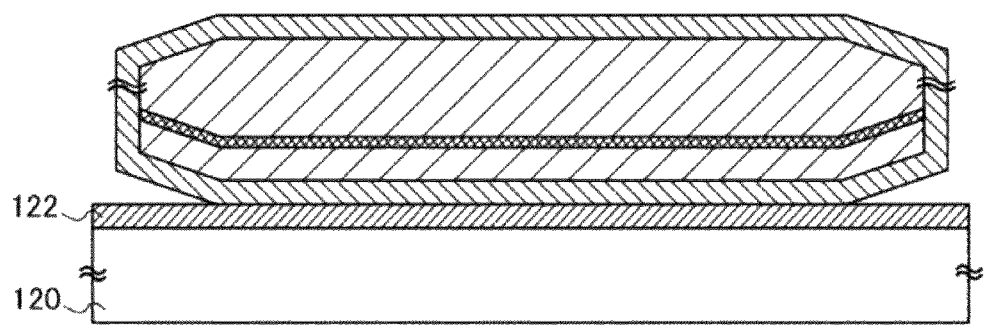
FIGS. 4A to 4C are cross-sectional views showing a method for manufacturing an SOI substrate.

First, the semiconductor substrate 100 processed through the above process is bonded to the base substrate 120 (see FIG. 4A and the step C-1 in FIG. 6). Here, the semiconductor substrate 100 and the base substrate 120 are bonded to each other with the insulating layer 102 and the insulating layer 122 interposed therebetween; however, this embodiment is not limited to this structure in the case where the insulating layers are not formed.

The bonding can be performed by applying pressure of higher than or equal to 0.001 N/cm$^2$ and lower than or equal to 100 N/cm$^2$, preferably higher than or equal to 1 N/cm$^2$ and lower than or equal to 20 N/cm$^2$ to one part at an end of the base substrate 120 so that bonding surfaces are close to each other. When pressure is applied so that the semiconductor substrate 100 approaches or is put in intimate contact with the base substrate 120, bonding of the substrates starts and spreads spontaneously to the entire surface. In this manner, the bonding between the base substrate 120 and the semiconductor substrate 100 is completed. This bonding is based on a principle of the Van der Waals force or the like, and strong bonding can be achieved even at room temperature.

Note that a region called an edge roll off region exists in a periphery of the semiconductor substrate 100. In the edge roll off region, the semiconductor substrate 100 (the insulating layer 102) is not in contact with the base substrate 120 (the insulating layer 122) in some cases. Also in a chamfer portion which exists outside the edge roll off region (on an end side of the semiconductor substrate 100), the base substrate 120 and the semiconductor substrate 100 are not in contact with each other.

In a CMP method used for manufacturing the semiconductor substrate 100, owing to its principle, polishing tends to progress in the periphery of the semiconductor substrate at higher speed than in a central portion thereof. Accordingly, in the periphery of the semiconductor substrate 100, a region where the thickness of the semiconductor substrate 100 is smaller than that in the central portion and the planarity is low is formed. This is the region called an edge roll off region. Even in the case where an end portion of the semiconductor substrate 100 is not chamfered, bonding with the base substrate 120 is not performed in such an edge roll off region in some cases.

In the case where a plurality of semiconductor substrates 100 are bonded to one base substrate 120, pressure is preferably applied to each of the semiconductor substrates 100. This is because a semiconductor substrate 100 which is not in contact with the base substrate 120 may be formed due to differences in the thickness of the semiconductor substrates 100. Note that even in the case where there are slight differences in the thickness of the semiconductor substrates 100, bonding can be favorably performed when the semiconductor substrates 100 can be put in intimate contact with the base substrate 120 owing to bend of the base substrate 120 or the like; therefore, this embodiment is not limited thereto.

After the semiconductor substrate 100 is bonded to the base substrate 120, a heat treatment for increasing the bonding strength is preferably performed (see the step C-2 in FIG. 6). The temperature of this heat treatment is preferably set to a temperature at which a crack is not caused in the embrittlement region 104, for example, higher than or equal to 200° C. and lower than or equal to 450° C. Alternatively, when the semiconductor substrate 100 is bonded to the base substrate 120 while being heated in this temperature range, a similar effect can be obtained. Note that it is preferable that the above heat treatment be successively performed in an apparatus or a place where the bonding has been performed. This is for prevention of separation of the substrates owing to transportation thereof before the heat treatment.

Note that when a particle or the like is attached to the bonding surface in bonding the semiconductor substrate 100 to the base substrate 120, the portion where the particle or the like is attached is not bonded. In order to avoid attachment of a particle, the semiconductor substrate 100 and the base substrate 120 are preferably bonded in a treatment chamber where air tightness is secured. At the time of bonding the semiconductor substrate 100 to the base substrate 120, the process chamber may be in a state of reduced pressure (e.g., approximately $5.0 \times 10^{-3}$ Pa) so that the atmosphere of the bonding treatment is clean.

Figure 4B:
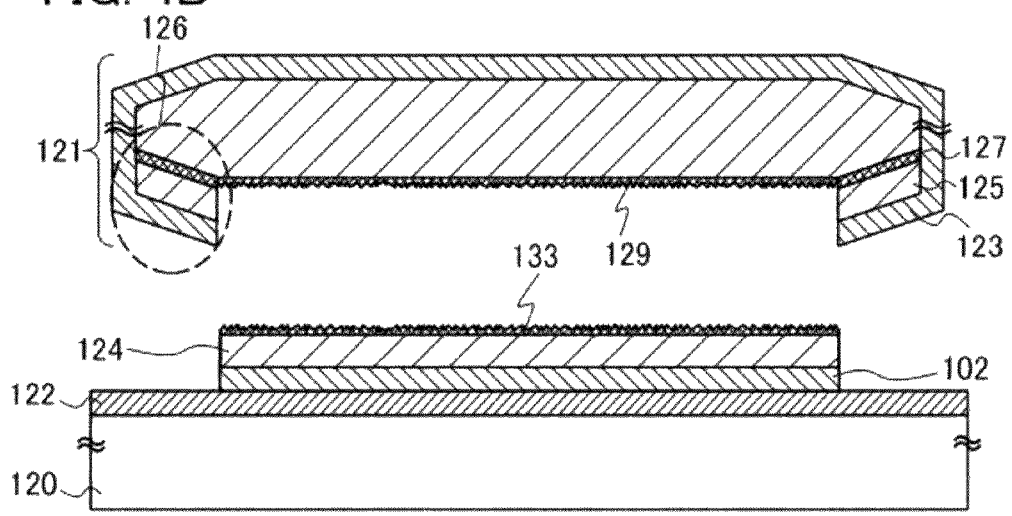
Figure 4C:
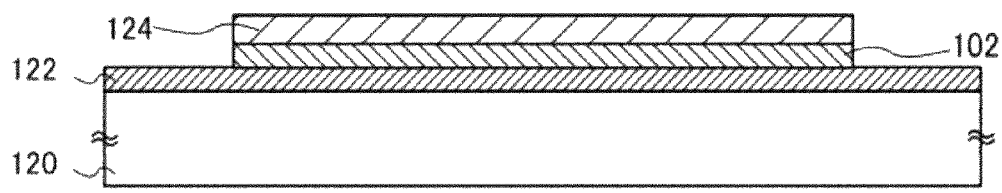

Next, a heat treatment is performed so that the semiconductor substrate 100 is separated along the embrittlement region 104, and thus the semiconductor layer 124 is formed on the base substrate 120 while the semiconductor substrate 121 is formed (see FIG. 4B and the step C-3 in FIG. 6). Since the semiconductor substrate 100 and the base substrate 120 are bonded to each other in a region other than the edge roll off region and the chamfer portion, the semiconductor layer 124 which is separated from the semiconductor substrate 100 is fixed on the base substrate 120.

Here, the heat treatment for separating the semiconductor layer 124 is performed at a temperature below the strain point of the base substrate 120. This heat treatment can be performed using a rapid thermal anneal (RTA) apparatus, a resistance heating furnace, a microwave heating apparatus, or the like. Examples of RTA apparatuses include a gas rapid thermal anneal (GRTA) apparatus, a lamp rapid thermal anneal (LRTA) apparatus, and the like. In the case of using a GRTA apparatus, the temperature can be set at higher than or equal to 550° C. and lower than or equal to 650° C., and the treatment time can be set to longer than or equal to 0.5 minute and shorter than or equal to 60 minutes. In the case of using a resistance heating furnace, the temperature can be set at higher than or equal to 200° C. and lower than or equal to 650° C., and the treatment time can be set to longer than or equal to 2 hours and shorter than or equal to 4 hours. Further, after the semiconductor layer 124 is separated, heat treatment may be performed at a temperature of 500° C. or higher so that the concentration of hydrogen that remains in the semiconductor layer 124 is reduced.

Further, the above heat treatment may be performed by irradiation with a microwave or the like. As a specific example, the semiconductor substrate 100 can be separated by being irradiated with a 2.45 GHz of microwave at 900 W for approximately 5 minutes to 30 minutes.

In interfaces along which the semiconductor layer 124 and the semiconductor substrate 121 have been separated, the semiconductor region 129 and a semiconductor region 133 are left. These regions correspond to the embrittlement region 104 before the separation. Therefore, the semiconductor region 129 and the semiconductor region 133 include a lot of hydrogen and crystal defects.

Further, the projecting portion 126 exists in a region of the semiconductor substrate 121, in which the bonding is not performed (specifically a region corresponding to the edge roll off region and the chamfer portion of the semiconductor substrate 100). The projecting portion 126 includes the semiconductor region 127, the unseparated semiconductor region 125, and the insulating layer 123. The semiconductor region 127, as well as the semiconductor region 129 and the like, has been part of the embrittlement region 104, and thus includes a lot of hydrogen and crystal defects. In addition, the semiconductor region 125 includes less hydrogen than the semiconductor region 127 or the like but includes crystal defects due to irradiation with ions or the like.

Next, a process of planarizing a surface of the semiconductor layer 124 which is bonded to the base substrate 120 to recover crystallinity is described. This process corresponds to Process D in FIG. 6.

The semiconductor region 133 on the semiconductor layer 124 which is put in intimate contact with the base substrate 120 has crystal defects and the planarity is lowered owing to formation of the embrittlement region 104 and separation of the semiconductor substrate 100 along the embrittlement region 104. Therefore, the semiconductor region 133 may be removed by polishing or the like so that the surface of the semiconductor layer 124 is planarized (see FIG. 4C and the step D-1 in FIG. 6). The planarization is not necessarily performed; however, the planarization enables improvement in characteristics of an interface between the semiconductor layer and a layer (e.g., an insulating layer) formed on a surface of the semiconductor layer in a later step. Specifically, polishing can be performed by chemical mechanical polishing, liquid jet polishing, or the like. Here, simultaneously with the removal of the semiconductor region 133, the semiconductor layer 124 is polished to be a thin film in some cases.

Further, the semiconductor region 133 can be removed by etching so that the semiconductor layer 124 is planarized. The above etching can be performed by a dry etching method such as a reactive ion etching (RIE) method, an inductively coupled plasma (ICP) etching method, an electron cyclotron resonance (ECR) etching method, a parallel plate (capacitively coupled) etching method, a magnetron plasma etching method, a dual-frequency plasma etching method, or a helicon wave plasma etching method. Note that both the polishing and the etching may be employed so that the semiconductor region 133 is removed and the surface of the semiconductor layer 124 is planarized.

Furthermore, by the polishing and the etching, in addition to the planarization of the surface of the semiconductor layer 124, the semiconductor layer 124 can be reduced in thickness so as to have a thickness which is suitable for the semiconductor element that is completed later.

Laser irradiation may be performed on the semiconductor region 133 and the semiconductor layer 124 in order to reduce crystal defects and improve the planarity (see the step D-2 in FIG. 6).

In the case where the semiconductor region 133 is removed and the surface of the semiconductor layer 124 is planarized by dry etching before the laser irradiation, defects might occur in the vicinity of the surface of the semiconductor layer 124. However, by the above laser irradiation, such defects can be repaired.

Since increase in the temperature of the base substrate 120 can be suppressed by using the laser irradiation step when compared to other thermal treatments, a substrate having low heat resistance can be used as the base substrate 120. It is preferable that the semiconductor region 133 to be completely melted and the semiconductor layer 124 to be partly melted by the laser irradiation. This is because when the semiconductor layer 124 is completely melted, recrystallization of the semiconductor layer 124 is accompanied with disordered nucleation of the semiconductor layer 124 in a liquid phase and the crystallinity of the semiconductor layer 124 is lowered. By partly melting the semiconductor layer 124, crystal growth progresses from a solid phase portion which is not melted; thus, crystal defects in the semiconductor layer 124 are reduced and the crystallinity is recovered. Note that complete melting of the semiconductor layer 124 indicates that the semiconductor layer 124 is melted up to the interface between the semiconductor layer 124 and the insulating layer 102 to be in a liquid state. On the other hand, partial melting of the semiconductor layer 124 indicates that a part of the semiconductor layer 124 (here an upper layer) is melted to be in a liquid phase while another part thereof (here a lower layer) remains in a solid phase.

After the laser irradiation, the surface of the semiconductor layer 124 may be etched. In this case, before the laser irradiation, the semiconductor region 133 may be etched or may not be etched. By this etching, the surface of the semiconductor layer 124 is planarized, and the semiconductor layer 124 can be reduced in thickness so as to have a thickness which is suitable for the semiconductor element that is completed later.

After the laser irradiation, the semiconductor layer 124 is preferably subjected to a heat treatment at higher than or equal to 500° C. and lower than or equal to 650° C. (see the step D-3 in FIG. 6). By this heat treatment, defects in the semiconductor layer 124 can be further reduced and distortion of the semiconductor layer 124 can be alleviated. For the heat treatment, a rapid thermal annealing (RTA) apparatus, a resistance heating furnace, a microwave heating apparatus, or the like can be used. Examples of RTA apparatuses include a gas rapid thermal anneal (GRTA) apparatus, a lamp rapid thermal anneal (LRTA) apparatus, and the like. For example, when a resistance heating furnace is used, the heat treatment may be performed approximately at 600° C. for 4 hours.

When the SOI substrate obtained through the above process is used for a subsequent process of manufacturing a semiconductor device, various kinds of semiconductor devices can be manufactured (see FIG. 6).

Next, a process of performing a reprocessing treatment on the semiconductor substrate 121 and manufacturing a reprocessed semiconductor substrate is described. This process corresponds to Process E in FIG. 6. Note that the above embodiments can be referred to for details of this process and only the outline is described here.

Figure 5A:
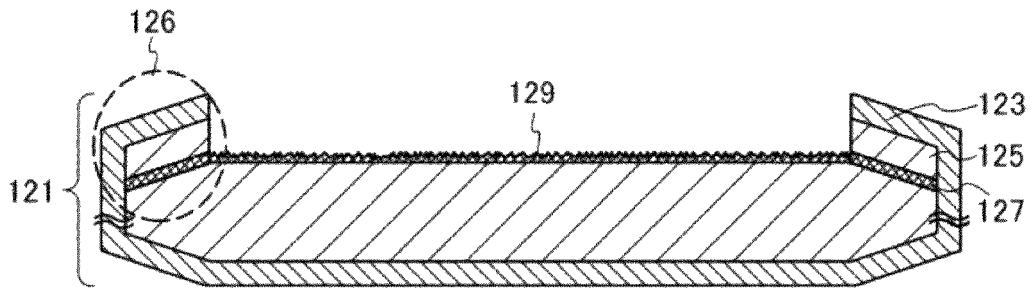
FIGS. 5A to 5F are cross-sectional views showing a method for manufacturing an SOI substrate.

The projecting portion 126 is formed in the periphery of the semiconductor substrate 121 (see FIG. 5A). The projecting portion 126 includes the semiconductor region 127, the unseparated semiconductor region 125, and the insulating layer 123. The semiconductor region 125 and the semiconductor region 127 include crystal defects due to the above ion irradiation. The semiconductor region 129 of the semiconductor substrate 121 also includes crystal defects and the planarity of the semiconductor region 129 is lowered. Therefore, the semiconductor region 125, the semiconductor region 127, and the semiconductor region 129 can be collectively referred to as damaged semiconductor regions.

Figure 5B:
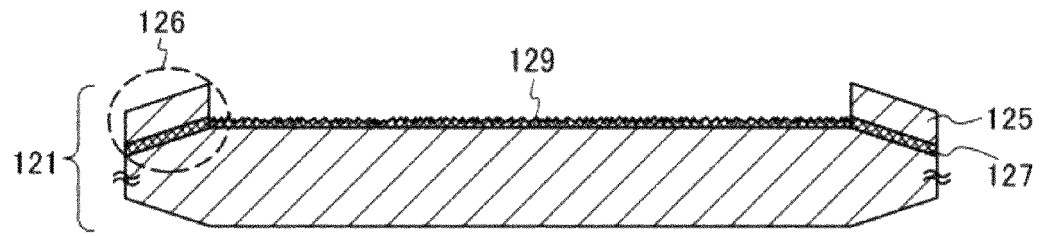

The first etching treatment is performed on the semiconductor substrate 121, and the insulating layer 123 is removed from the semiconductor substrate 121 (see FIG. 5B and the step E-1 in FIG. 6). The above embodiments may be referred to for details of this step.

Figure 5C:
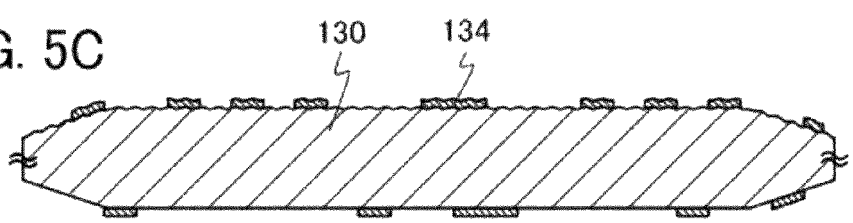

Next, the second etching treatment is performed, so that the semiconductor region 125 and the semiconductor region 127 which are included in the projecting portion 126 of the semiconductor substrate 121 are selectively removed and the reprocessed semiconductor substrate 132 is formed (see FIG. 5C and the step E-2 in FIG. 6). At this time, the semiconductor region 129 is also removed. The above embodiments can also be referred to for details of this step.

Figure 5D:
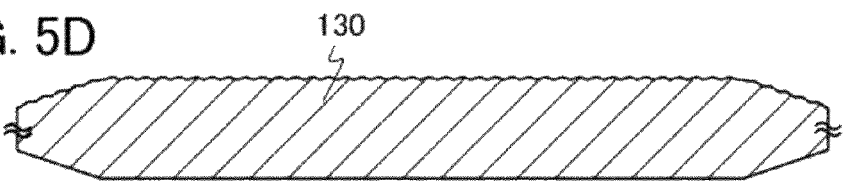

Next, the first oxide film 134 partly remaining on the surface of the semiconductor substrate 130 is removed (see FIG. 5D and the step E-3 in FIG. 6). The above embodiments can also be referred to for details of this step.

Figure 5E:
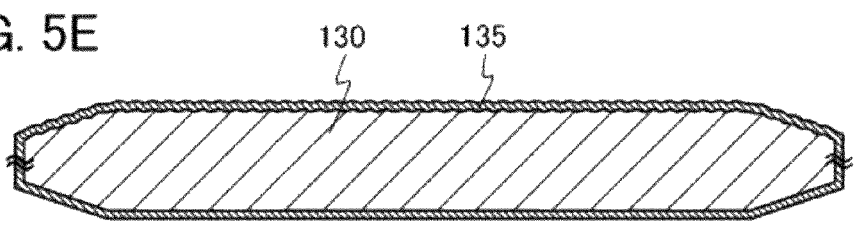

Then, the second oxide film 135 is formed to cover the surface of the semiconductor substrate 130 (see FIG. 5E and the step E-4 in FIG. 6). The above embodiments can also be referred to for details of this step.

Figure 5F:
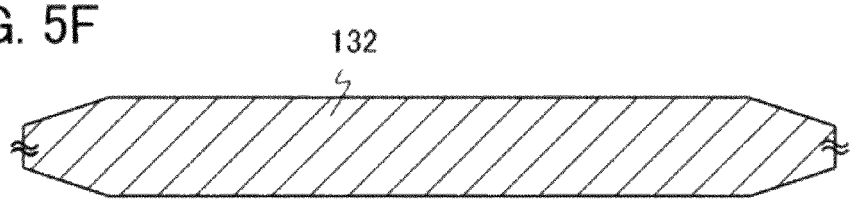

Finally, the removal of the second oxide film 135 and planarization of the semiconductor substrate 130 are performed by the polishing treatment such as the CMP method (see FIG. 5F and the step E-5 in FIG. 6). The above embodiments can also be referred to for details of this step.

Accordingly, after removing the projecting portion 126 from the semiconductor substrate 121 by the first etching treatment and the second etching treatment, the second oxide film 135 is formed on the surface of the semiconductor substrate 130, so that the semiconductor substrate 130 is polished evenly at a uniform rate. Therefore, the reprocessed semiconductor substrate 132 having favorable planarity can be obtained.

In the above manner, the semiconductor substrate 121 is reprocessed into the reprocessed semiconductor substrate 132. The obtained reprocessed semiconductor substrate 132 can be reused as the semiconductor substrate 100 in Process A.

As shown in this embodiment, the semiconductor substrate processed through the reprocessing treatment process is repeatedly used, whereby manufacturing cost for an SOI substrate can be reduced. In particular, when the method shown in this embodiment or the like is employed, a damaged semiconductor region can be selectively removed; therefore, the amount of the semiconductor removed by the reprocessing treatment can be reduced and a sufficient number of times of reprocessing can be secured.

The structure shown in this embodiment can be used in appropriate combination with the structure shown in any of the other embodiments.

Embodiment 3

In this embodiment, the case where an SOI substrate is manufactured using a silicon substrate with high heat resistance or the like as a base substrate will be described. Note that a method shown in this embodiment has many points in common with the above embodiment. Therefore, different points will be mainly shown in this embodiment. Drawings will not be particularly shown in this embodiment because those of the above embodiment can be commonly used.

In a semiconductor substrate that is used as a bond substrate, an insulating layer and an embrittlement region are formed. Treatments for the semiconductor substrate, which include the formation of the insulating layer and the embrittlement region, are similar to those in the above embodiments. Therefore, description in the above embodiments may be referred to for such treatments.

In this embodiment, a substrate with high heat resistance is used as a base substrate. Examples of a substrate with high heat resistance include a quartz substrate, a sapphire substrate, semiconductor substrates (e.g., a single crystal silicon substrate and a polycrystalline silicon substrate), and the like. In this embodiment, the case where a single crystal silicon substrate is used as the base substrate is described.

A typical example of a single crystal silicon substrate is a circular substrate of 5 inches (125 mm) in diameter, 6 inches (150 mm) in diameter, 8 inches (200 mm) in diameter, 12 inches (300 mm) in diameter, or 16 inches (400 mm) in diameter. Note that the shape is not limited to the circular shape, and a silicon substrate which is processed into a rectangular shape or the like can also be used. In the description given below, the case where a rectangular single crystal silicon substrate is used as the base substrate is described. Note that the size of the base substrate may be substantially the same as or different from that of the bond substrate.

Note that a surface of the base substrate is preferably cleaned using a sulfuric acid/hydrogen peroxide mixture (SPM), an ammonium hydroxide/hydrogen peroxide mixture (APM), a hydrochloric acid/hydrogen peroxide mixture (HPM), dilute hydrofluoric acid (DHF), a solution of hydrofluoric acid, hydrogen peroxide water, and pure water (FPM) or the like, as appropriate. Further, dilute hydrofluoric acid and ozone water may be discharged alternately to clean the surface of the semiconductor substrate 100.

An insulating layer may be formed on the base substrate. In the case where an insulating layer is formed on the base substrate, an insulating layer on the bond substrate side can be omitted. The insulating layer may be formed using a single insulating film or a stacked layer including a plurality of insulating films. The insulating layer can be formed using an insulating film which contains silicon as a component, such as a silicon oxide film, a silicon nitride film, a silicon oxynitride film, or a silicon nitride oxide film.

For example, the above insulating layer can be formed by a thermal oxidation treatment. Although dry oxidation is preferably employed as the thermal oxidation treatment, the thermal oxidation treatment may be performed in an oxidation atmosphere to which a halogen-containing gas is added. As the halogen-containing gas, one or plural kinds of gases selected from HCl, HF, $NF_3$, HBr, $Cl_2$, $ClF_3$, $BCl_3$, $F_2$, $Br_2$, and the like can be used.

The surface of the base substrate is cleaned before bonding. The surface of the base substrate can be cleaned with chlorine acid and hydrogen peroxide water or by megahertz ultrasonic cleaning, two-fluid jet cleaning, cleaning with ozone water, or the like. Further, the bonding may be performed after the surface is subjected to a surface activation treatment such as irradiation treatment with an atomic beam or an ion beam, an ultraviolet treatment, an ozone treatment, a plasma treatment, a plasma treatment with bias application, or a radical treatment.

Next, the semiconductor substrate (the bond substrate) and the base substrate are bonded to each other, and the semiconductor substrate is separated. Accordingly, a semiconductor layer is formed on the base substrate. The above embodiment can be referred to for details of this process.

In this embodiment, the single crystal silicon substrate with high heat resistance is used as the base substrate. Therefore, the upper limit of the temperature of various heat treatments can be raised up to the vicinity of a melting point of the single crystal silicon substrate.

For example, the upper limit of the temperature of a heat treatment for separating the semiconductor substrate can be set at approximately 1200° C. When the temperature of this heat treatment is set at 700° C. or higher, bonding strength with the base substrate can be further increased.

Next, a surface of the semiconductor layer bonded to the base substrate is planarized, and the crystallinity is recovered.

In the semiconductor layer which is put in intimate contact with the base substrate, crystal defects due to formation of the embrittlement region and separation of the semiconductor substrate along the embrittlement region are formed, and the planarity of the semiconductor layer is lowered. Therefore, a heat treatment is preferably performed to reduce the crystal defects and to improve the planarity of the surface. The heat treatment is preferably performed under the temperature condition of 800° C. to 1300° C., typically 850° C. to 1200° C. When heat treatment is performed under such a relatively high temperature condition, crystal defects can be sufficiently reduced and the planarity of the surface can be improved.

For the heat treatment, a rapid thermal anneal (RTA) apparatus, a resistance heating furnace, a microwave heating apparatus, or the like can be used. For example, in the case of using a resistance heating furnace, the heat treatment may be performed approximately at 950° C. to 1150° C. for 1 minute to 4 hours. Note that the heat treatment for separating the semiconductor substrate, if performed at higher temperature, can be performed instead of this heat treatment.

The semiconductor layer may be irradiated with a laser beam before or after the heat treatment. By the laser irradiation, crystal defects that cannot be repaired by the heat treatment can be repaired. The above embodiment can be referred to for details of the laser irradiation.

In addition, before or after the heat treatment, a semiconductor region in an upper portion of the semiconductor layer may be removed by polishing or the like so that the surface thereof is planarized. By this planarization treatment, the surface of the semiconductor layer can be further planarized. Specifically, the polishing can be a chemical mechanical polishing (CMP), a liquid jet polishing, or the like. Note that the semiconductor layer may be reduced in thickness by this treatment in some cases.

Alternatively, the semiconductor region in the upper portion of the semiconductor layer can be removed by etching so that the surface thereof is planarized. For the above etching, for example, a dry etching method such as a reactive ion etching (RIE) method, an inductively coupled plasma (ICP) etching method, an electron cyclotron resonance (ECR) etching method, a parallel plate (capacitively coupled) etching method, a magnetron plasma etching method, a dual-frequency plasma etching method, or a helicon wave plasma etching method can be employed. Note that both the polishing and the etching may be used for the planarization.

Furthermore, by the polishing and the etching, in addition to the planarization of the surface of the semiconductor layer, the semiconductor layer can be reduced in thickness so as to have a thickness which is suitable for the semiconductor element that is completed later.

When the SOI substrate obtained through the above process is used for a subsequent process of manufacturing a semiconductor device, various kinds of semiconductor devices can be manufactured.

The above embodiment can be referred to for details of a reprocessing treatment.

As shown in this embodiment, the semiconductor substrate processed through the reprocessing treatment process is repeatedly used, whereby manufacturing cost for an SOI substrate can be reduced. In particular, by employing such heat treatment at high temperature as shown in this embodiment, an SOI substrate having favorable characteristics can be manufactured even when there remain slightly a few defects in the bond substrate.

The structure shown in this embodiment can be used in appropriate combination with the structure described in any of the other embodiments.

Embodiment 4

Figure 7:
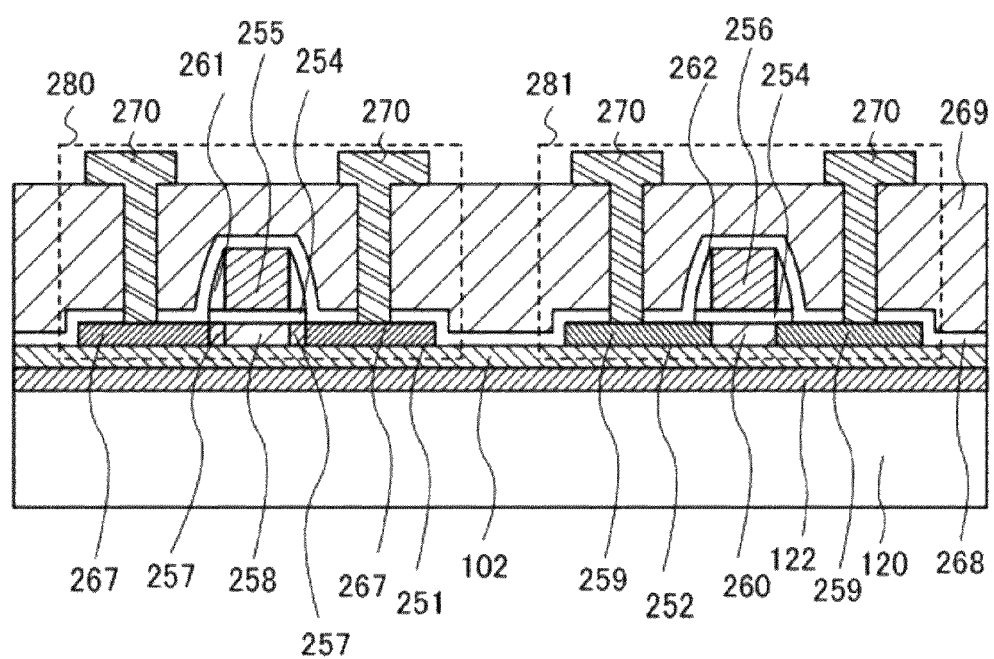
FIG. 7 is a cross-sectional view showing a semiconductor device using an SOI substrate.

FIG. 7 shows an example of a semiconductor device which includes the SOI substrate manufactured in either of the above embodiments.

FIG. 7 is an example of a semiconductor device including a transistor 280 which is an n-channel thin film transistor and a transistor 281 which is a p-channel thin film transistor. The transistor 280 and the transistor 281 are formed over the base substrate 120 with the insulating layer 102 and the insulating layer 122 interposed therebetween. Various kinds of semiconductor devices can be formed by combining such a plurality of thin film transistors (TFTs). A method for manufacturing the semiconductor device shown in FIG. 7 is described below.

First, an SOI substrate is prepared. As the SOI substrate, the SOI substrate manufactured in either of the above embodiments can be used.

Next, a semiconductor layer is etched to be divided into an island-shaped semiconductor layer 251 and an island-shaped semiconductor layer 252. The semiconductor layer 251 is included in the n-channel TFT, and the semiconductor layer 252 is included in the p-channel TFT.

An insulating layer 254 is formed over the semiconductor layer 251 and the semiconductor layer 252, and then a gate electrode 255 and a gate electrode 256 are respectively formed over the semiconductor layer 251 and the semiconductor layer 252 with the insulating layer 254 interposed therebetween.

In order to control a threshold voltage of the TFTs, it is preferable to add an impurity element which serves as an acceptor, such as boron, aluminum, or gallium, or an impurity element which serves as a donor, such as phosphorus or arsenic, to the semiconductor layers. For example, an impurity element which serves as an acceptor is added into a region where the n-channel TFT is to be formed, and an impurity element which serves as a donor is added to a region where the p-channel TFT is to be formed.

Next, an n-type low-concentration impurity region 257 is formed in the semiconductor layer 251, and a p-type high-concentration impurity region 259 is formed in the semiconductor layer 252. Specifically, first, the semiconductor layer 252 used for the p-channel TFT is covered with a resist mask and an impurity element is added to the semiconductor layer 251, so that the n-type low-concentration impurity region 257 is formed in the semiconductor layer 251. Phosphorus or arsenic may be added as the impurity element. The gate electrode 255 serves as a mask, whereby the n-type low-concentration impurity region 257 is formed in the semiconductor layer 251 in a self-aligned manner. Further, a region of the semiconductor layer 251, which overlaps with the gate electrode 255, serves as a channel formation region 258. Next, after the mask which covers the semiconductor layer 252 is removed, the semiconductor layer 251 used for the n-channel TFT is covered with a resist mask. Then, an impurity element is added to the semiconductor layer 252. Boron, aluminum, gallium, or the like may be added as the impurity element. Here, the gate electrode 256 functions as a mask, and the p-type high-concentration impurity region 259 is formed in the semiconductor layer 252 in a self-aligned manner. A region of the semiconductor layer 252, which overlaps with the gate electrode 256, serves as a channel formation region 260. Note that the method in which the n-type low-concentration impurity region 257 is formed and then the p-type high-concentration impurity region 259 is formed is described in this embodiment; however, the p-type high-concentration impurity region 259 can be formed first.

Next, after the resist mask which covers the semiconductor layer 251 is removed, an insulating layer having a single-layer structure or a stacked structure, which includes a nitride such as silicon nitride or an oxide such as silicon oxide, is formed by a plasma CVD method or the like. This insulating layer is anisotropically etched in a perpendicular direction, whereby a sidewall insulating layer 261 and a sidewall insulating layer 262 are formed in contact with side surfaces of the gate electrode 255 and the gate electrode 256, respectively. Note that the insulating layer 254 is also etched by the above anisotropic etching.

Next, the semiconductor layer 252 is covered with a resist mask, and an impurity element is added to the semiconductor layer 251 at a high dose. By this treatment, the gate electrode 255 and the sidewall insulating layer 261 serve as masks, and an n-type high-concentration impurity region 267 is formed.

After an activation treatment (a heat treatment) of the impurity elements, an insulating layer 268 containing hydrogen is formed. After the formation of the insulating layer 268, a heat treatment is performed at higher than or equal to 350° C. and lower than or equal to 450° C., whereby hydrogen contained in the insulating layer 268 is diffused into the semiconductor layer 251 and the semiconductor layer 252. The insulating layer 268 can be formed by deposition of silicon nitride or silicon nitride oxide by a plasma CVD method at a process temperature of 350° C. or lower. By supplying hydrogen to the semiconductor layer 251 and the semiconductor layer 252, defects which serve as trapping centers in the semiconductor layer 251, the semiconductor layer 252, or at the interfaces between the semiconductor layers and the insulating layer 254 can be repaired effectively.

After that, an interlayer insulating layer 269 is formed. The interlayer insulating layer 269 can be formed to have a single-layer structure or a stacked structure including an insulating film containing an inorganic material such as silicon oxide or borophosphosilicate glass (BPSG), or an insulating film containing an organic material such as polyimide or acrylic. After contact holes are formed in the interlayer insulating layer 269, wirings 270 are formed. For example, the wirings 270 can be formed using a conductive film with a three-layer structure in which a low-resistance metal film such as an aluminum film or an aluminum alloy film is sandwiched between barrier metal films. The barrier metal films can be formed using molybdenum, chromium, titanium, or the like.

Through the above process, a semiconductor device having the n-channel TFT and the p-channel TFT can be manufactured. The SOI substrate used for the semiconductor device of this embodiment is manufactured at extremely low cost, as shown in the above embodiments. Accordingly, cost for manufacturing the semiconductor device can be reduced.

Note that the semiconductor device shown in FIG. 7 and a manufacturing method thereof are described in this embodiment; however, the structure of a semiconductor device of an embodiment of the invention to be disclosed is not limited thereto. The semiconductor device may include a capacitor, a resistor, a photoelectric conversion element, a light-emitting element, or the like in addition to a TFT.

Note that the structure described in this embodiment can be used in appropriate combination with the structure described in any of the other embodiments.

EXAMPLE 1

In this example, a semiconductor substrate obtained in the manufacturing process of an SOI substrate was subjected to the removal of an insulating layer and the removal of a step in the periphery of the semiconductor substrate. After these treatments, a semiconductor substrate was subjected to cycle cleaning and a CMP treatment, and another semiconductor substrate was subjected only to a CMP treatment; then, the planarity of the semiconductor substrates was evaluated and compared using a magic mirror system. The results will be shown below.

First, the semiconductor substrates used in this example will be described.

In this example, a rectangular single crystal silicon substrate with a size of 5-inch square was used as the semiconductor substrate. First, thermal oxidation was performed on the semiconductor substrate in an HCl atmosphere to form a thermal oxide film with a thickness of 100 nm on a surface of the substrate. The thermal oxidation was performed under the condition of 950° C. for 4 hours in a thermal oxidation atmosphere containing HCl at 3 volume % with respect to oxygen.

Next, hydrogen was added to the semiconductor substrate through the surface of the thermal oxide film with the use of an ion doping apparatus. In this example, by irradiation with ionized hydrogen, an embrittlement region was formed in the semiconductor substrate. Conditions of ion doping were such that the acceleration voltage was 40 kV and the dose was $2.0 \times 10^{16}$ ions/cm$^2$.

Then, the semiconductor substrate was bonded to a glass substrate with the thermal oxide film interposed therebetween. After that, a heat treatment was performed at 200° C. for 120 minutes and further a heat treatment was performed at 600° C. for 120 minutes, whereby a thin single crystal silicon layer was separated from the semiconductor substrate at the embrittlement region. As a result, an SOI substrate was manufactured and at the same time, a semiconductor substrate having a projecting portion in the periphery was manufactured.

Next, a treatment performed on the above semiconductor substrate will be described.

First, in order to remove an insulating layer covering the semiconductor substrate, the semiconductor substrate was subjected to a wet etching treatment using a solution (product name: LAL500, produced by Stella Chemifa Corporation) containing hydrofluoric acid, ammonium fluoride, and a surfactant. At this time, the solution temperature was room temperature and the etching time was 300 seconds.

Next, the semiconductor substrate from which the insulating layer had been removed was subjected to wet etching using, as an etchant, a solution A where hydrofluoric acid, nitric acid, and acetic acid were mixed at a volume ratio of 1:3:10. The solution A was produced using hydrofluoric acid at a concentration of 50 weight % (produced by Stella Chemifa Corporation), nitric acid at a concentration of 70 weight % (produced by Wako Pure Chemical Industries, Ltd.), and acetic acid at a concentration of 97.7 weight % (produced by Kishida Chemical Co., Ltd). At this time, the solution temperature was room temperature and the etching time was 4 minutes. Two semiconductor substrates A and B, on which the above treatments were performed, were prepared.

Then, only the semiconductor substrate A was subjected to cycle cleaning. Here, the cycle cleaning refers to a cleaning treatment in which the removal of an oxide film formed on the surface of a semiconductor substrate and the formation of another oxide film are alternately performed. Specifically, while the semiconductor substrate is rotated at 600 cycles per second, the surface of the semiconductor substrate is treated with ozone water for 6 seconds and then treated with an aqueous solution containing hydrofluoric acid for 6 seconds, and these treatments are repeated 4 times. After that, while the semiconductor substrate is rotated at 600 cycles per second, the surface of the semiconductor substrate is treated with ozone water for 20 seconds. Here, the concentration of ozone water is approximately 9.5 ppm to 10.5 ppm, and the concentration of the aqueous solution containing hydrofluoric acid is 0.5%.

Next, the semiconductor substrate A and the semiconductor substrate B were subjected to a CMP treatment with a high polishing rate. In the CMP treatment, a polyurethane polishing cloth and silica-based slurry (ILD1300, produced by Nitta Haas Incorporated, a grain size of 150 nm, and 20-fold dilution) were used. The slurry flow rate was 200 ml/min, the polishing pressure was 0.02 MPa, the spindle rotation speed was 30 rpm, the table rotation speed was 30 rpm, and the processing time was 6 minutes.

After that, the semiconductor substrate A and the semiconductor substrate B were subjected to a CMP treatment with a low polishing rate. In this CMP treatment, a suede polishing cloth (Supreme, produced by Nitta Haas Incorporated) and silica-based slurry (NP8020, produced by Nitta Haas Incorporated, a grain size of 60 nm, and 20-fold dilution) were used. The slurry flow rate was 200 ml/min, the polishing pressure was 0.01 MPa, the spindle rotation speed was 30 rpm, the table rotation speed was 30 rpm, and the processing time was 6 minutes.

Then, the semiconductor substrate A and the semiconductor substrate B were measured using the magic mirror system MIS-2000Z (produced by KOBELCO Research Institute, Inc.), and observed images were taken.

The magic mirror system is described here. The magic mirror system is an apparatus used to detect minute convex and concave patterns on a surface which are not easily visible even at close range. The patterns are detected by the application of the principle of the magic mirror: when the minute convex and concave patterns are carved on the surface of a mirror and light is reflected so that an image is formed at a distance increased by about several meters, the focal point starts to be blurred and seen as a pattern. With the principle of the magic mirror, invisible convex and concave patterns on a mirror-finished surface of a sample can be displayed as a dark image for the convex portion and the blight image for a concave portion. With the use of this apparatus, macro-level surface roughness, protuberance, concave, polishing dent, grinding marks, cracks, thermal slip, and the like on the surface of a substrate can be observed.

Figure 8A:
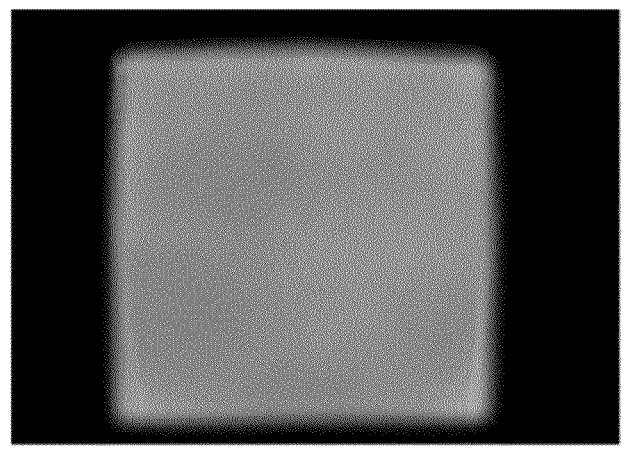
FIGS. 8A and 8B are images of a semiconductor substrate observed using a magic mirror system.
Figure 8B:
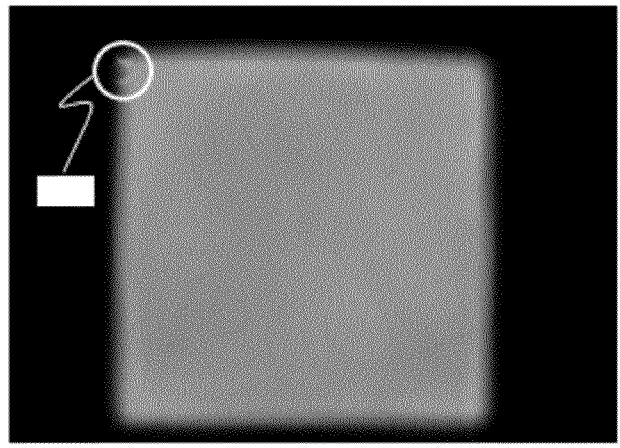

FIGS. 8A and 8B are respectively images of a semiconductor substrate A and a semiconductor substrate B observed using the magic mirror system. FIG. 8A shows that roughness is hardly observed on the surface of the semiconductor substrate A that was subjected to the cycle cleaning before the CMP treatment. On the other hand, on the semiconductor substrate B that was subjected to the CMP treatment without the cycle treatment, a dark image, namely, a projecting portion 300 is observed at the upper left corner of the image.

It is considered that the projecting portion 300 of the semiconductor substrate B occurs for the following reason: the polishing rate in the CMP treatment was different between the oxide film partly remaining on the surface of the semiconductor substrate B after the etching with the solution A, and the exposed portion of the semiconductor substrate B; as a consequence, the surface of the semiconductor substrate B was not polished evenly. On the other hand, the semiconductor substrate A on which an oxide film was formed and removed alternately by the cycle cleaning so that a thin uniform oxide film was formed, has favorable uniformity since the surface of the substrate was polished at a uniform polishing rate by the CMP treatment after the oxide film had been removed evenly.

As described above, in the process of selectively removing a step in the periphery of a substrate, by performing a CMP method after an oxide film partly remaining is removed and a thin uniform oxide film is formed on the surface of a semiconductor substrate, a reprocessed semiconductor substrate having more favorable planarity can be manufactured.

This application is based on Japanese Patent Application serial no. 2009-194318 filed with Japan Patent Office on Aug. 25, 2009, the entire contents of which are hereby incorporated by reference.

What is claimed is:

1. A method for reprocessing a semiconductor substrate comprising the steps of:

performing a first etching treatment on a semiconductor substrate comprising a first damaged semiconductor region and a projecting portion, the projection portion including a second damaged semiconductor region and an insulating layer over the second damaged semiconductor region, whereby the insulating layer is removed;

performing a second etching treatment on the semiconductor substrate, after performing the first etching treatment, by using a solution containing a first substance capable of oxidizing a semiconductor material included in the semiconductor substrate, a second substance capable of dissolving an oxidized semiconductor material, and a third substance capable of controlling a speed of oxidation of the semiconductor material and a speed of dissolution of the oxidized semiconductor material, whereby the first and the second damaged semiconductor regions are removed selectively with respect to a non-damaged semiconductor region;

performing a third etching treatment after the second etching treatment, whereby oxidized portions of the semiconductor material at the surface of the semiconductor substrate are removed;

forming an oxide film on a surface of the semiconductor substrate after performing the third etching treatment; and performing a polishing treatment on a surface of the oxide film, whereby the surface of the semiconductor substrate is exposed and planarized.

2. The method for reprocessing a semiconductor substrate according to claim 1, wherein the projection portion corresponds to a peripheral region of the semiconductor substrate.

3. The method for reprocessing a semiconductor substrate according to claim 1, wherein the third etching treatment and the formation of the oxide film are repeatedly performed.

4. The method for reprocessing a semiconductor substrate according to claim 1, further comprising the step of repeatedly forming a second oxide film and removing the second oxide film at the surface of the semiconductor substrate after the second etching treatment.

5. The method for reprocessing a semiconductor substrate according to claim 1, wherein the oxide film is formed using an aqueous solution containing ozone.

6. The method for reprocessing a semiconductor substrate according to claim 1, wherein the third etching treatment is performed by using a solution containing hydrofluoric acid.

7. The method for reprocessing a semiconductor substrate according to claim 1, wherein the polishing treatment is performed by using chemical-mechanical polishing (CMP).

8. The method for reprocessing a semiconductor substrate according to claim 1,
wherein nitric acid is used as the first substance that oxidizes the semiconductor material included in the semiconductor substrate;
wherein hydrofluoric acid is used as the second substance that dissolves the oxidized semiconductor material; and
wherein acetic acid is used as the third substance that controls the speed of oxidation of the semiconductor material and the speed of dissolution of the oxidized semiconductor material.

9. The method for fabricating an SOI substrate according to claim 1, after the polishing treatment, further comprising steps of:
forming an insulating layer on the semiconductor substrate;
irradiating the semiconductor substrate with ions through the insulating layer to form an embrittlement region;
bringing into contact the insulating layer of the semiconductor substrate and an insulating surface of a base substrate to bond the semiconductor substrate to the base substrate, the insulating layer being interposed therebetween; and
performing a heat treatment on the bonded substrates to cleave the semiconductor substrate along the embrittlement region, whereby an SOI substrate is formed.

10. The method for fabricating an SOI substrate according to claim 1, wherein the first substance comprises a nitric acid, the second substance comprises a hydrofluoric acid, and the third substance comprises an acetic acid.

11. A method for fabricating an SOI substrate comprising:
forming an insulating layer on a surface of a semiconductor substrate;
irradiating the semiconductor substrate with ions through the insulating layer to form an embrittlement region;
bringing into contact the insulating layer of the semiconductor substrate and an insulating surface of a base substrate to bond the semiconductor substrate to the base substrate, the insulating layer being interposed therebetween;

performing a heat treatment on the bonded substrates to cleave the semiconductor substrate along the embrittlement region, whereby a first SOI substrate is formed and whereby a first damaged semiconductor region and a projection portion are formed on the semiconductor substrate, the projection portion including a second damaged semiconductor region and a portion of the insulating layer over the second damaged semiconductor region;

after the heat treatment, performing a first etching treatment on the semiconductor substrate, whereby the insulating layer is removed;

performing a second etching treatment on the semiconductor substrate, after performing the first etching treatment, by using a solution containing a first substance capable of oxidizing a semiconductor material included in the semiconductor substrate, a second substance capable of dissolving an oxidized semiconductor material, and a third substance capable of controlling a speed of oxidation of the semiconductor material and a speed of dissolution of the oxidized semiconductor material, whereby the first and the second damaged semiconductor regions are removed selectively with respect to a non-damaged semiconductor region;

performing a third etching treatment after the second etching treatment, whereby oxidized portions of the semiconductor material at the surface of the semiconductor substrate are removed;

forming an oxide film on a surface of the semiconductor substrate after performing the third etching treatment; and performing a polishing treatment on a surface of the oxide film, whereby the surface of the semiconductor substrate is exposed and planarized.

12. The method for fabricating an SOI substrate according to claim 11, further comprising a step of performing a bonding strength enhancing heat treatment on the bonded substrates.

13. The method for fabricating an SOI substrate according to claim 11, wherein the projection portion corresponds to a peripheral region of the semiconductor substrate.

14. The method for fabricating an SOI substrate according to claim 11, wherein the third etching treatment and the formation of the oxide film are repeatedly performed.

15. The method for fabricating an SOI substrate according to claim 11, further comprising the step of repeatedly forming a second oxide film and removing the second oxide film at the surface of the semiconductor substrate after the third etching treatment.

16. The method for fabricating an SOI substrate according to claim 11, wherein the oxide film is formed using an aqueous solution containing ozone.

17. The method for fabricating an SOI substrate according to claim 11, wherein the third etching treatment is performed by using a solution containing hydrofluoric acid.

18. The method for fabricating an SOI substrate according to claim 11, wherein the polishing treatment is performed by using chemical-mechanical polishing (CMP).

19. The method for fabricating an SOI substrate according to claim 11,
wherein nitric acid is used as the first substance that oxidizes the semiconductor material included in the semiconductor substrate;
wherein hydrofluoric acid is used as the second substance that dissolves the oxidized semiconductor material; and wherein acetic acid is used as the third substance that controls the speed of oxidation of the semiconductor material and the speed of dissolution of the oxidized semiconductor material.

20. The method for fabricating an SOI substrate according to claim 11, wherein the semiconductor substrate has a peripheral region thinner than a central region.

21. The method for fabricating an SOI substrate according to claim 11, after the polishing treatment, further comprising steps of:
   forming an insulating layer on the semiconductor substrate;
   irradiating the semiconductor substrate with ions through the insulating layer to form an embrittlement region;
   bringing into contact the insulating layer of the semiconductor substrate and an insulating surface of a second base substrate to bond the semiconductor substrate to the second base substrate, the insulating layer being interposed therebetween; and
   performing a heat treatment on the bonded substrates to cleave the semiconductor substrate along the embrittlement region, whereby a second SOI substrate is formed.

22. The method for fabricating an SOI substrate according to claim 11, wherein the first substance comprises a nitric acid, the second substance comprises a hydrofluoric acid, and the third substance comprises an acetic acid.

* * * * *